(12) United States Patent
Kim et al.

(10) Patent No.: US 11,086,720 B2
(45) Date of Patent: *Aug. 10, 2021

(54) MEMORY SYSTEM AND OPERATING METHOD THEREOF

(71) Applicant: SK hynix Inc., Gyeonggi-do (KR)

(72) Inventors: Yong-Tae Kim, Gyeonggi-do (KR); Soong-Sun Shin, Gyeonggi-do (KR); Duck-Hoi Koo, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/532,965

(22) Filed: Aug. 6, 2019

(65) Prior Publication Data

US 2019/0361778 A1 Nov. 28, 2019

Related U.S. Application Data

(63) Continuation of application No. 15/813,502, filed on Nov. 15, 2017, now Pat. No. 10,379,955.

(30) Foreign Application Priority Data

Mar. 29, 2017 (KR) ........................ 10-2017-0039915

(51) Int. Cl.
*G06F 11/00* (2006.01)
*G06F 11/30* (2006.01)
(Continued)

(52) U.S. Cl.
CPC ........ *G06F 11/1402* (2013.01); *G06F 11/102* (2013.01); *G06F 11/1048* (2013.01);
(Continued)

(58) Field of Classification Search
CPC ............ G06F 11/1402; G06F 11/1048; G06F 11/102; G11C 16/26; G11C 16/3431; G11B 20/10388
See application file for complete search history.

(56) References Cited

U.S. PATENT DOCUMENTS 7,613,045 B2 11/2009 Murin et al.
10,229,749 B2 3/2019 Oh et al.
(Continued)

FOREIGN PATENT DOCUMENTS

CN 1949368 A 4/2007
CN 106205731 A 12/2016
(Continued)

OTHER PUBLICATIONS

Office Action issued by the Chinese Patent Office dated Oct. 14, 2020.

(Continued)

*Primary Examiner* — Samir W Rizk
(74) *Attorney, Agent, or Firm* — IP & T Group LLP

(57) ABSTRACT

A memory system may include: a memory device including a plurality of storage regions; and a controller. The controller may be coupled between a host and the memory device, and perform a read retry operation when a read error occurs in any one of the storage regions based on occurrence possibilities for a plurality of different type of defects in any one storage region where a read error occurred.

31 Claims, 17 Drawing Sheets

(51) Int. Cl.
    *G08C 25/00*     (2006.01)
    *H03M 13/00*     (2006.01)
    *H04L 1/00*     (2006.01)
    *G06F 11/14*     (2006.01)
    *G06F 11/10*     (2006.01)
    *G11C 16/26*     (2006.01)
    *G11B 20/10*     (2006.01)
    *G11C 16/34*     (2006.01)
    *G11B 20/18*     (2006.01)
(52) U.S. Cl.
    CPC ...... *G06F 11/141* (2013.01); *G11B 20/10388* (2013.01); *G11C 16/26* (2013.01); *G11C 16/3431* (2013.01); *G11B 2020/183* (2013.01)

(56) References Cited

U.S. PATENT DOCUMENTS

| | | | |
|---|---|---|---|
| 2007/0011581 A1* | 1/2007 | Nakanishi | G11C 29/82 714/768 |
| 2011/0019493 A1 | 1/2011 | Ikeda et al. | |
| 2012/0236656 A1 | 9/2012 | Cometti | |
| 2014/0047269 A1 | 2/2014 | Kim | |
| 2015/0043282 A1 | 2/2015 | Shin et al. | |
| 2015/0188575 A1* | 7/2015 | Chou | G06F 11/1012 714/755 |
| 2016/0170871 A1* | 6/2016 | Hyun | G06F 3/0653 711/103 |
| 2016/0357472 A1 | 12/2016 | Choi et al. | |

FOREIGN PATENT DOCUMENTS

| | | |
|---|---|---|
| CN | 106251903 A | 12/2016 |
| KR | 10-2014-0014547 A | 2/2014 |
| KR | 10-2015-0018921 A | 2/2015 |

OTHER PUBLICATIONS

Certificate of Invention Patent issued by the CNIPA dated Jun. 1, 2021.

Office Action issued by the Korean Intellectual Property Office dated Apr. 19, 2021.

* cited by examiner

FIG. 12

|  | E/W Count | Read Count | Operating Temperature |
|---|---|---|---|
| Region 1 | | | |
| Region 2 | | | |
| Region 3 | | | |
| ... | | | |
| Region N | | | |

FIG. 13

|  | Defect 1 | Defect 2 | Defect 3 | Defect 4 |
|---|---|---|---|---|
| Region 1 | Possibility 1 | Possibility 2 | Possibility 3 | Possibility 4 |
| Region 2 | Possibility 2 | Possibility 1 | Possibility 3 | Possibility 4 |
| Region 3 | Possibility 3 | Possibility 4 | Possibility 1 | Possibility 2 |
| ... | | | | |
| Region N | Possibility 4 | Possibility 3 | Possibility 2 | Possibility 1 |

MEMORY SYSTEM AND OPERATING
METHOD THEREOF

CROSS-REFERENCE TO RELATED APPLICATIONS

This application is a continuation of U.S. patent application Ser. No. 15/813,502 filed on Nov. 15, 2017, which claims benefits of priority of Korean Patent Application No. 10-2017-0039915 filed on Mar. 29, 2017. The disclosure of each of the foregoing application is incorporated herein by reference in its entirety.

BACKGROUND

1. Field

Various embodiments of the present disclosure relate to a memory system and an operating method thereof.

2. Description of the Related Art

Recently, the paradigm of the computer environment is changed into a ubiquitous computing environment which allows users to get an access to a computer system anywhere anytime. For this reason, the use of portable electronic devices, such as mobile phones, digital cameras, laptop computers and the like, is surging. The portable electronic devices generally employ a memory system using a memory device for storing data. A memory system may be used as a main memory device or an auxiliary memory device of a portable electronic device.

A memory device has excellent stability and durability because it does not include a mechanical driving unit. Also, the memory device is advantageous in that it may access data quickly and consume a small amount of power. Non-limiting examples of a memory device having these advantages include a universal serial bus (USB) memory device, a memory card with diverse interfaces, and a solid-state drive (SSD).

SUMMARY

Various embodiments are directed to a memory controller for a read retry operation, a memory system and an operating method thereof.

In an embodiment, a memory system may include: a memory device including a plurality of storage regions; and a controller. The controller may be coupled between a host and the memory device, and perform a read retry operation when a read error occurs in any one of the storage regions based on occurrence possibilities for a plurality of different type of defects in any one storage region where a read error occurred.

In an embodiment, a memory controller may include: a read retry table including a plurality of read retry sets; and a processor suitable for sorting a plurality of different type of defects based on occurrence possibilities for the respective defects in any one storage region among a plurality of storage regions included in a memory device, when a read error occurred in the any one storage region, selecting a read retry set among the plurality of read retry sets according to the sorted defect order, and performing a read retry operation using the selected read retry set.

In an embodiment, an operating method of a memory controller may include: sorting a plurality of different type of defects based on occurrence possibilities for the respective defects in any one storage region among a plurality of storage regions included in a memory device, when a read error occurred in the any one storage region; selecting a read retry set among a plurality of read retry sets included in a read retry table, according to the sorted defect order; and performing a read retry operation using the selected read retry set.

BRIEF DESCRIPTION OF THE DRAWINGS

The above and other features and advantages of the present invention will become more apparent to those skilled in the art to which the present invention pertains by the following detailed description with reference to the attached drawings in which:

FIG. 12 is a diagram illustrating an example in which status information is written to each storage region of a memory device by a status tracker in accordance with an embodiment;

FIG. 13 is a diagram illustrating an example in which read error occurrence possibilities for a plurality of different type of defects are decided in each storage region in accordance with an embodiment;

DETAILED DESCRIPTION

Various embodiments will be described below in more detail with reference to the accompanying drawings. The following descriptions will be focused on portions which are required for understanding operations in accordance with the embodiments, and the descriptions of the other portions will be omitted in order not to unnecessarily obscure subject matters of the present embodiments.

Hereinafter, the various embodiments of the present invention will be described in detail with reference to the attached drawings.

Figure 1:
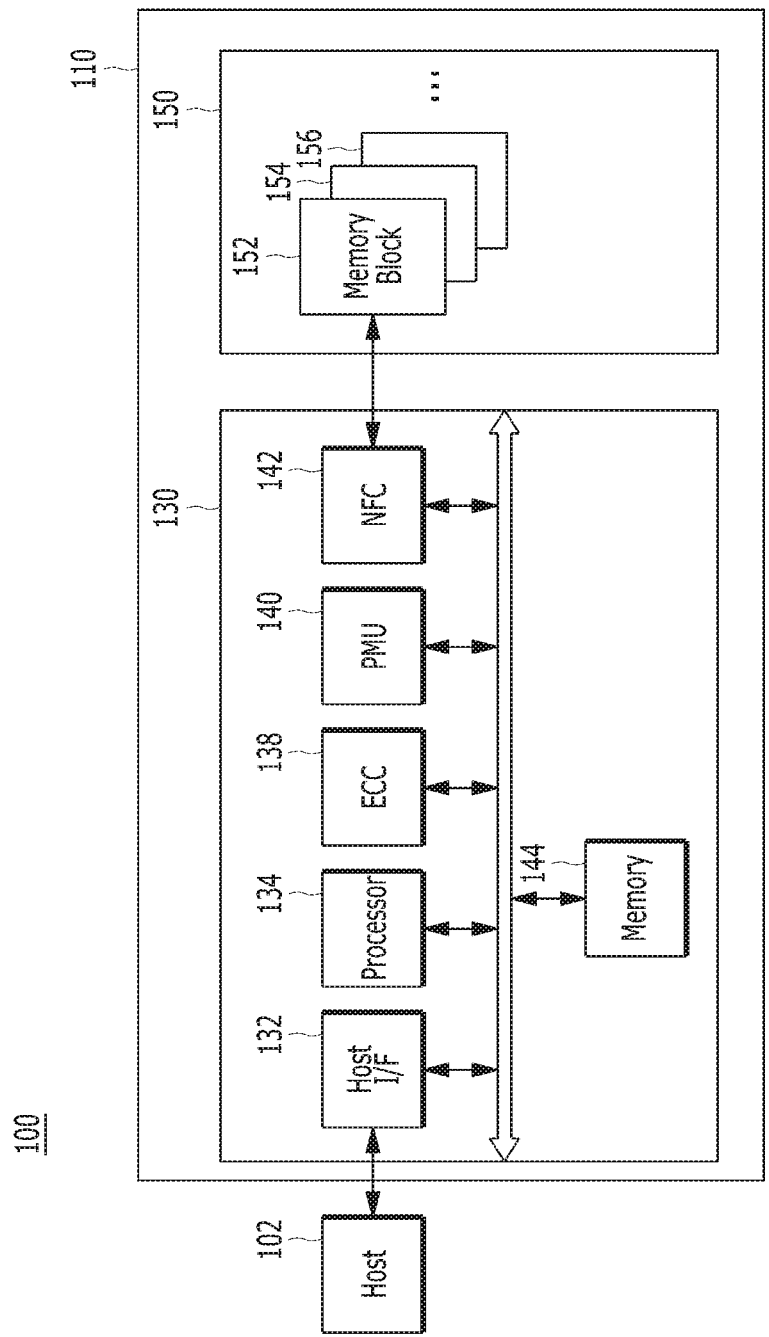
FIG. 1 is a block diagram illustrating a data processing system including a memory system in accordance with an embodiment of the present disclosure.

FIG. 1 is a block diagram illustrating a data processing system 100 including a memory system 110 in accordance with an embodiment of the present disclosure.

Referring to FIG. 1, the data processing system 100 may include a host 102 operatively coupled to the memory system 110.

The host 102 may be any suitable electronic device including portable electronic devices such as a mobile phone, MP3 player and laptop computer or non-portable electronic devices such as a desktop computer, game machine, television (TV) and projector. The host 102 may include at least one operating system (OS), and the OS may manage and control the overall functions and operations of the host 102, and also provide an operation between the host 102 and a user using the data processing system 100 or the memory system 110. The OS may support functions and operations corresponding to the use purpose and usage of a user. For example, the OS may be divided into a general OS and a mobile OS, depending on the mobility of the host 102. The general OS may be divided into a personal OS and an enterprise OS, depending on the environment of a user. For example, the personal OS configured to support a function of providing a service to general users may include Windows and Chrome, and the enterprise OS configured to secure and support high performance may include Windows server, Linux and Unix. Furthermore, the mobile OS configured to support a function of providing a mobile service to users and a power saving function of a system may include Android, iOS and Windows Mobile. The host 102 may include one or more of Oss. The host 102 may execute an OS to perform an operation corresponding to a user's request on the memory system 110.

The memory system 110 may operate to store data for the host 102 in response to a request of the host 102. Non-limited examples of the memory system 110 may include a solid state drive (SSD), a multi-media card (MMC), a secure digital (SD) card, universal storage bus (USB) device, a universal flash storage (UFS) device, compact flash (CF) card, a smart media card (SMC), a personal computer memory card international association (PCMCIA) card and memory stick. The MMC may include an embedded MMC (eMMC), reduced size MMC (RS-MMC) and micro-MMC. The SD card may include a mini-SD card and micro-SD card.

The memory system 110 may be embodied by various types of storage devices. Non-limited examples of storage devices included in the memory system 110 may include volatile memory devices such as a dynamic random access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), resistive RAM (RRAM) and a flash memory. The flash memory may have a 3-dimensional (3D) stack structure.

The memory system 110 may include a memory device 150 and a controller 130. The memory device 150 may store data for the host 120, and the controller 130 may control data storage into the memory device 150.

The controller 130 and the memory device 150 may be integrated into a single semiconductor device, which may be included in the various types of memory systems as exemplified above.

Non-limited application examples of the memory system 110 may include a computer, an Ultra Mobile PC (UMPC), a workstation, a net-book, a Personal Digital Assistant (PDA), a portable computer, a web tablet, a tablet computer, a wireless phone, a mobile phone, a is smart phone, an e-book, a Portable Multimedia Player (PMP), a portable game machine, a navigation system, a black box, a digital camera, a Digital Multimedia Broadcasting (DMB) player, a 3-dimensional television, a smart television, a digital audio recorder, a digital audio player, a digital picture recorder, a digital picture player, a digital video recorder, a digital video player, a storage device constituting a data center, a device capable of transmitting/receiving information in a wireless environment, one of various electronic devices constituting a home network, one of various electronic devices constituting a computer network, one of various electronic devices constituting a telematics network, a Radio Frequency Identification (RFID) device, or one of various components constituting a computing system.

The memory device 150 may be a nonvolatile memory device and may retain data stored therein even though power is not supplied. The memory device 150 may store data provided from the host 102 through a write operation, and provide data stored therein to the host 102 through a read operation. The memory device 150 may include a plurality of memory dies (not shown), each memory die including a plurality of planes (not shown), each plane including a plurality of memory blocks 152 to 156, each of the memory blocks 152 to 156 may include a plurality of pages, and each of the pages may include a plurality of memory cells coupled to a word line.

The controller 130 may control the memory device 150 in is response to a request from the host 102. For example, the controller 130 may provide data read from the memory device 150 to the host 102, and store data provided from the host 102 into the memory device 150. For this operation, the controller 130 may control read, write, program and erase operations of the memory device 150.

The controller 130 may include a host interface (I/F) unit 132, a processor 134, an error correction code (ECC) unit 138, a Power Management Unit (PMU) 140, a NAND flash controller (NFC) 142 and a memory 144 all operatively coupled via an internal bus.

The host interface unit 132 may be configured to process a command and data of the host 102, and may communicate with the host 102 through one or more of various interface protocols such as universal serial bus (USB), multi-media card (MMC), peripheral component interconnect-express (PCI-e), small computer system interface (SCSI), serial-attached SCSI (SAS), serial advanced technology attachment (SATA), parallel advanced technology attachment (PATA), enhanced small disk interface (ESDI) and integrated drive electronics (IDE).

The ECC unit 138 may detect and correct an error contained in the data read from the memory device 150. In other words, the ECC unit 138 may perform an error correction decoding process to the data read from the memory device 150 through an ECC code used during an ECC encoding process. According to a result of the error correction decoding process, the ECC unit 138 may output a signal, for example, an error correction success/fail signal.

When the number of error bits is more than a threshold value of correctable error bits, the ECC unit 138 may not correct the error bits, and may output an error correction fail signal.

The ECC unit 138 may perform error correction through a coded modulation such as Low Density Parity Check (LDPC) code, Bose-Chaudhri-Hocquenghem (BCH) code, turbo code, Reed-Solomon code, convolution code, Recursive Systematic Code (RSC), Trellis-Coded Modulation (TCM) and Block coded modulation (BCM). However, the ECC unit 138 is not limited thereto. The ECC unit 138 may include all circuits, modules, systems or devices for error correction.

The PMU 140 may provide and manage power of the controller 130.

The NFC 142 may serve as a memory/storage interface for interfacing the controller 130 and the memory device 150 when the memory device is a NAND flash memory, such that the controller 130 controls the memory device 150 in response to a request from the host 102. When the memory device 150 is a flash memory or specifically a NAND flash memory, the NFC 142 may generate a control signal for the memory device 150 and process data to be provided to the memory device 150 under the control of the processor 134. The NFC 142 may work as an interface (e.g., a NAND flash interface) for processing a command and data between the controller 130 and the memory device 150. Specifically, the NFC 142 may support data transfer between the controller 130 and the memory device 150. Other memory/storage interfaces may be used when a different type memory device is employed.

The memory 144 may serve as a working memory of the memory system 110 and the controller 130, and store data for driving the memory system 110 and the controller 130. The controller 130 may control the memory device 150 to perform read, write, program and erase operations in response to a request from the host 102. The controller 130 may provide data read from the memory device 150 to the host 102, may store data provided from the host 102 into the memory device 150. The memory 144 may store data required for the controller 130 and the memory device 150 to perform these operations.

The memory 144 may be embodied by a volatile memory. For example, the memory 144 may be embodied by static random access memory (SRAM) or dynamic random access memory (DRAM). The memory 144 may be disposed within or out of the controller 130. FIG. 1 exemplifies the memory 144 disposed within the controller 130. In an embodiment, the memory 144 may be embodied by an external volatile memory having a memory interface transferring data between the memory 144 and the controller 130.

The processor 134 may control the overall operations of the memory system 110. The processor 134 may drive firmware to control the overall operations of the memory system 110. The firmware may be referred to as flash translation layer (FTL).

The processor 134 of the controller 130 may include a management unit (not illustrated) for performing a bad management operation of the memory device 150. The management unit may perform a bad block management operation of checking a bad block, in which a program fail occurs due to the characteristic of a NAND flash memory during a program operation, among the plurality of memory blocks 152 to 156 included in the memory device 150. The management unit may write the program-failed data of the bad block to a new memory block. In the memory device 150 having a 3D stack structure, the bad block management operation may reduce the use efficiency of the memory device 150 and the reliability of the memory system 110. Thus, the bad block management operation needs to be performed with more reliability.

Figure 2:
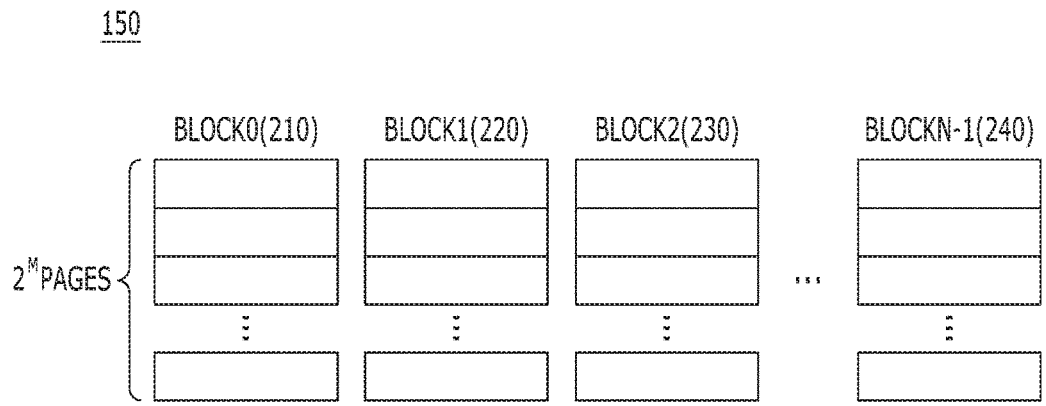
FIG. 2 is a schematic diagram illustrating an exemplary configuration of a memory device employed in the memory system of FIG. 1.

FIG. 2 is a schematic diagram illustrating an exemplary configuration of the memory device 150 employed in the memory system 110 shown in FIG. 1.

Referring to FIG. 2, the memory device 150 may include a plurality of memory blocks 0 to N-1, and each of the blocks 0 to N-1 may include a plurality of pages, for example, $2^M$ pages, the number of which may vary according to circuit design. Memory cells included in the respective memory blocks 0 to N-1 may be one or more of a single level cell (SLC) storing 1-bit data, a multi-level cell (MLC) storing 2-bit data, an MLC storing 3-bit data also referred to as a triple level cell (TLC), an MLC storing 4-bit data also referred to as a quadruple level cell (QLC), or an MLC storing 5-bit or more bit data.

Figure 3:
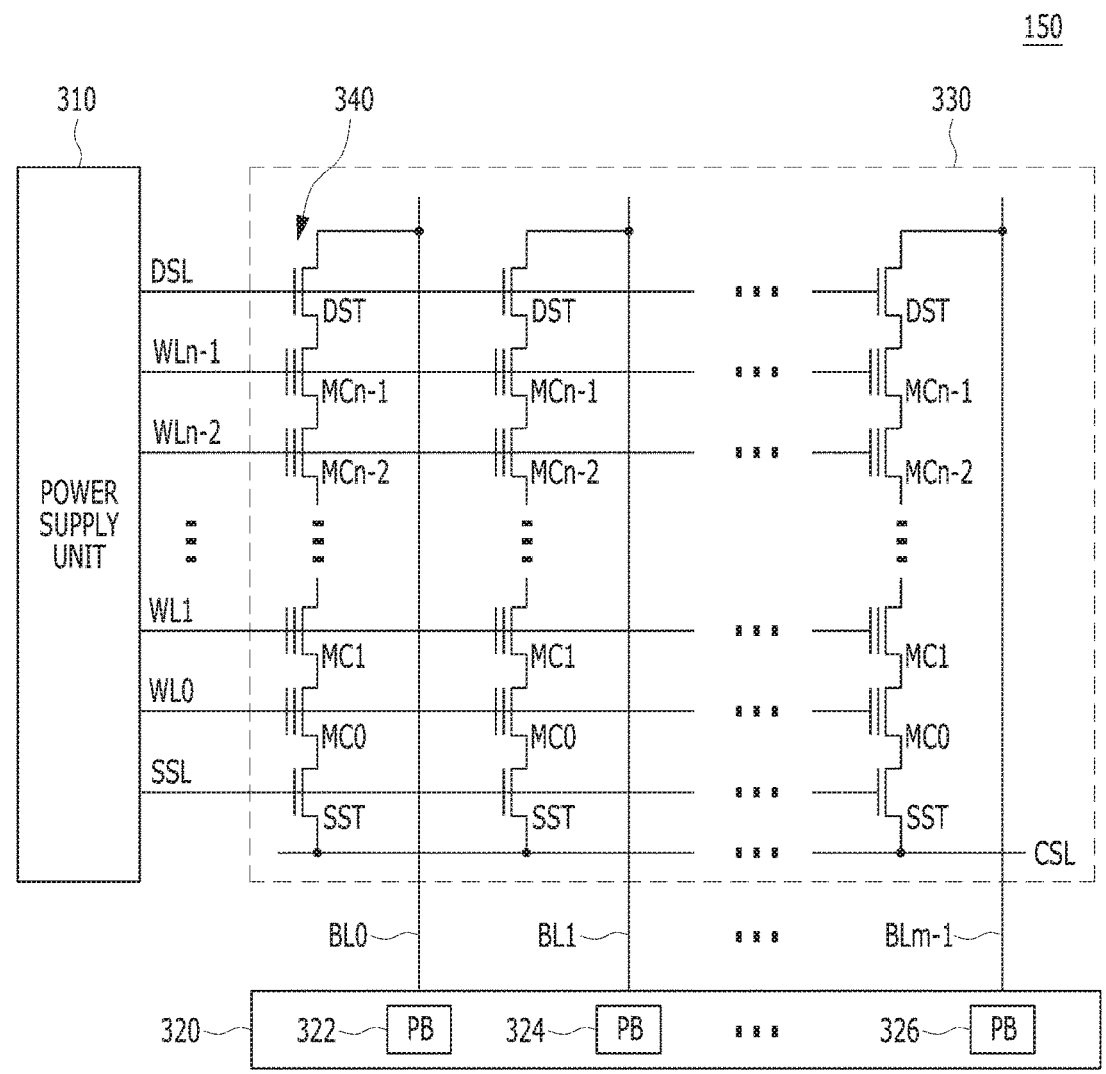
FIG. 3 is a circuit diagram illustrating an exemplary configuration of a memory cell array of a memory block in the memory device shown in FIG. 2.

FIG. 3 is a circuit diagram illustrating an exemplary configuration of a memory cell array of a memory block in the memory device 150 of FIG. 2.

Referring to FIG. 3, a memory block 330 which may correspond to any of the plurality of memory blocks 152 to 156 included in the memory device 150 of the memory system 110 may include a plurality of cell strings 340 coupled to a plurality of corresponding bit lines BL0 to BLm-1. The cell string 340 of each column may include one or more drain select transistors DST and one or more source select transistors SST. Between the drain and select transistors DST and SST, a plurality of memory cells MC0 to MCn-1 may be coupled in series. In an embodiment, each of the memory cell transistors MC0 to MCn-1 may be embodied by an MLC capable of storing data information of a plurality of bits. Each of the cell strings 340 may be electrically coupled to a corresponding bit line among the plurality of bit lines BL0 to BLm-1. For example, as illustrated in FIG. 3, the first cell string is coupled to the first bit line BL0, and the last cell string is coupled to the last bit line BLm-1.

Although FIG. 3 illustrates NAND flash memory cells, the invention is not limited in this way. For example, it is noted that the memory cells may be NOR flash memory cells, or hybrid flash memory cells including two or more kinds of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage supply unit 310 which provides word line voltages including a program voltage, a read voltage and a pass voltage to supply to the word lines according to an operation mode. The voltage generation operation of the voltage supply unit 310 may be controlled by a control circuit (not illustrated). Under the control of the control circuit, the voltage supply unit 310 may select one of the memory blocks (or sectors) of the memory cell array, select one of the word lines of the selected memory block, and provide the word line voltages to the selected word line and the unselected word lines as may be needed.

The memory device 150 may include a read/write circuit 320 which is controlled by the control circuit. During a verification/normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs), and each of the page buffers 322 to 326 may include a plurality of latches (not illustrated).

Figure 4:
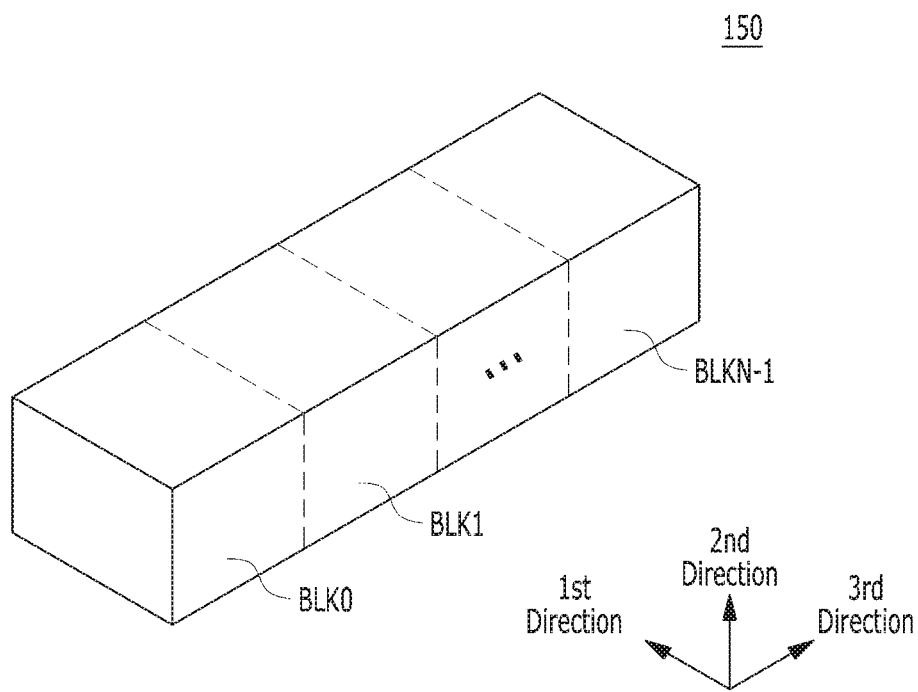
FIG. 4 is a schematic diagram illustrating an exemplary three-dimensional structure of the memory device shown in FIG. 2.

FIG. 4 is a schematic diagram illustrating an exemplary three-dimensional (3D) structure of the memory device 150 of FIG. 2.

The memory device 150 may be embodied by a two-dimensional (2D) or three-dimensional (3D) memory device. Specifically, as illustrated in FIG. 4, the memory device 150 may be embodied by a nonvolatile memory device having a 3D stack structure. When the memory device 150 has a 3D structure, the memory device 150 may include a plurality of memory blocks BLK0 to BLKN-1 each having a 3D structure (or vertical structure).

In the above-described memory device (for example, NAND flash memory), a read error may occur due to retention, read disturb or a difference between the temperature of the storage device during a programming (or write) of a data and the temperature of the storage device during reading of the same data. When a read error occurs, a read operation may be re-performed while read voltage levels contained in a predefined read retry table are applied in a predetermined order. The read operation may be re-performed until the read operation is successfully performed or all of the read voltage levels in the table are applied.

Figure 5:
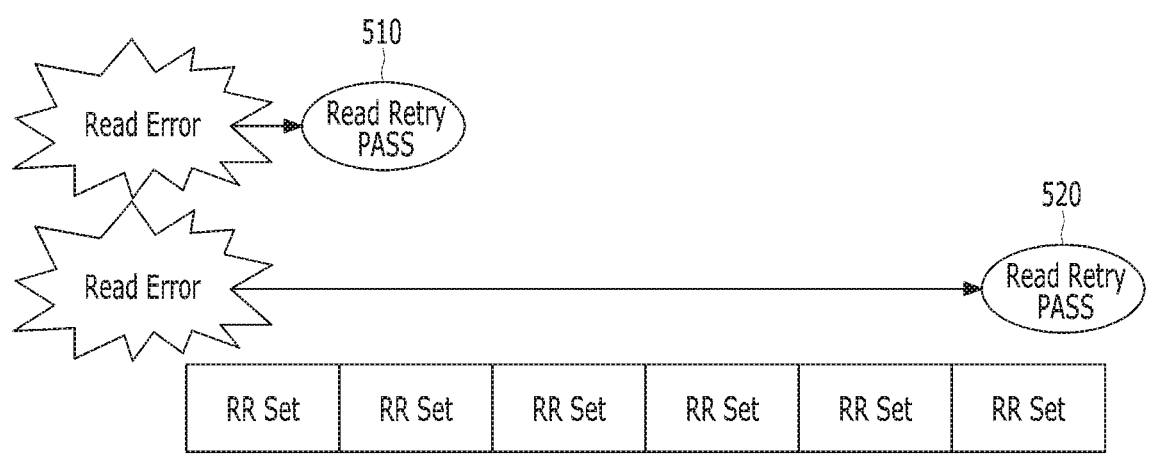
FIG. 5 is a diagram illustrating an example in which read retry operations are performed according to a predetermined order.
Figure 6:
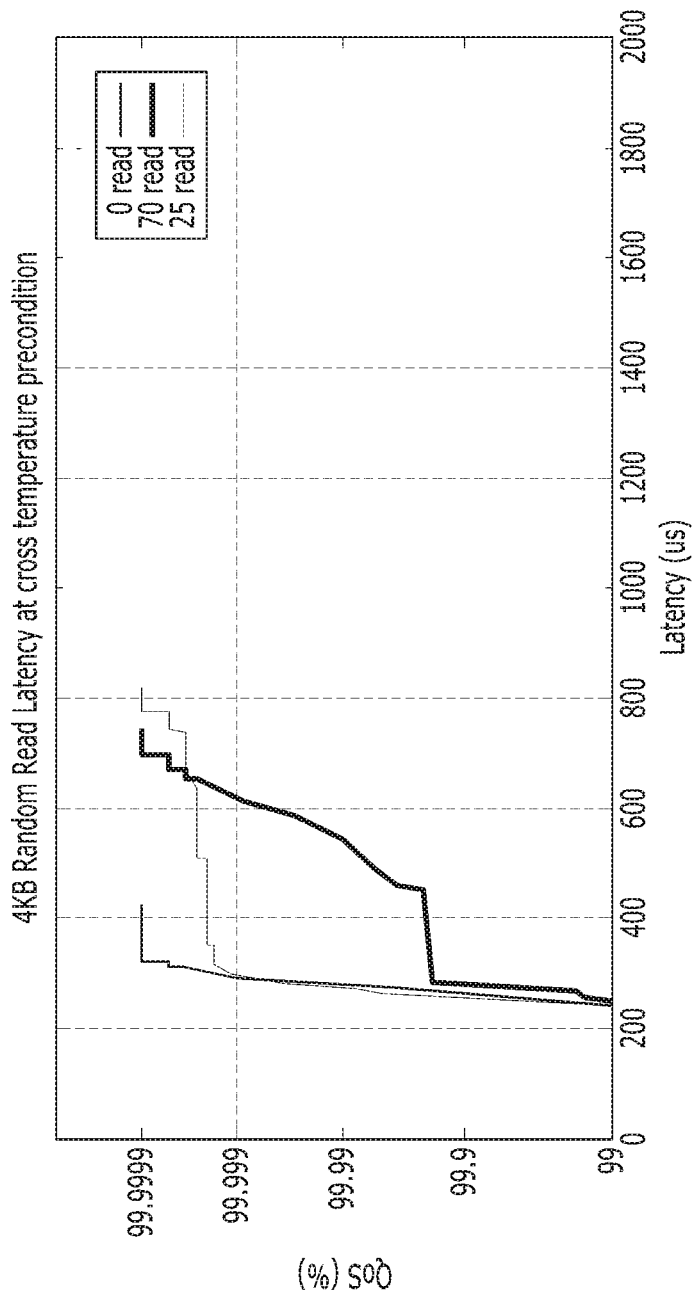
FIG. 6 is a diagram illustrating an example in which a latency difference occurs depending on the number of read retry operations for the same defect.

In general, since a read error may be caused by a plurality of different type defects in a memory device, the read retry table may include a plurality of retry sets corresponding to the respective types of the defects as illustrated in FIG. 5. Since a read retry operation according to the related art is performed in a fixed order, the read retry operation may require a large amount of time. For example, in the best case, a read operation may be successfully performed at the first step 510. In the worst case, however, a read operation may be successfully performed at the final step 520. Besides, although read retry operations are performed for the same defect as illustrated in FIG. 6, a latency difference may occur depending on the number of read retry operations.

Various embodiments of the present invention provide a read retry method that determines an occurrence possibility for each defect type when a read error occurs, and performs a read retry operation based on a retry set that is selected based a descending order of the occurrence possibility for each type of defect. In an embodiment, the read retry method can predict which defects are more likely to occur for each storage region of a memory storage device, for example, each block, die or page, and perform a read retry operation for an error occurring in a storage region by selecting a read retry set from a read retry table which corresponds to the defect having the highest occurrence possibility for the storage region, thereby shortening a time required for the error correction.

Figure 7A:
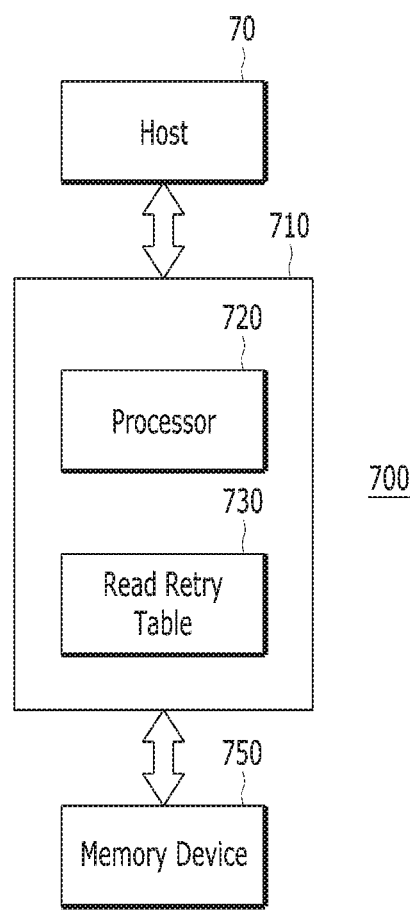
FIG. 7A is a diagram illustrating a data processing system in accordance with an embodiment.

FIG. 7A is a diagram illustrating a data processing system in accordance with an embodiment.

Referring to FIG. 7A, the data processing system may include a host 70 and a memory system (or storage device) 700. The memory system 700 may include a controller 710 and a memory device 750. The controller 710 and the memory device 750 of FIG. 7A may correspond to the controller 130 and the memory device 150 of FIG. 1, respectively. The controller 710 and the memory device 750 may perform operations corresponding to the controller 130 and the memory device 150 of FIG. 1, respectively. For convenience of description, however, the controller 710 and the memory device 750 may be limited to an example in which the controller 710 and the memory device 750 perform a read retry operation in accordance with the present embodiment.

The memory device 750 may include a plurality of storage regions. For example, the memory device 750 may include a plurality of memory chips. Each of the memory chips may be divided into a plurality of dies, and each of the dies may be divided into a plurality of planes. Each of the planes may include a plurality of blocks, and each of the blocks may include a plurality of pages.

The controller 710 may be coupled between the host 70 and the memory device 750, and perform various operations such as read, write and erase operations, according to a request of the host 70. The controller 710 may perform a read operation on any one storage region among the plurality of storage regions included in the memory device 750. When a read error occurs during a read operation, the controller 710 may perform various retry operations such as a read retry operation. The controller 710 may include a processor 720 and a read retry table 730. For example, the processor 720 may correspond to the processor 134 illustrated in FIG. 1. For another example, the processor 720 may correspond to the processor 134 and the NFC 142 which are illustrated in FIG. 1.

Figure 14:
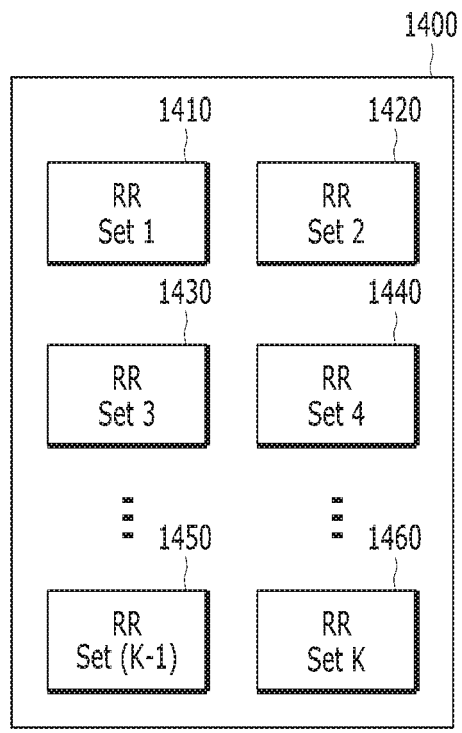
FIG. 14 is a diagram illustrating an example in which a read retry table is provided for a plurality defects in accordance with an embodiment.

In accordance with various embodiments, when a read error occurs in a storage region among the plurality of storage regions included in the memory device 750, the processor 720 of the controller 710 may perform a read retry operation based on the respective occurrence possibilities of a plurality of different type of defects which may be the cause of the detected error in the storage region. The processor 720 may then perform the read retry operation by referring to the read retry table 730. The read retry table 730 may include a plurality of read retry sets corresponding to the respective defects which are likely to occur in the memory device 750. The read retry table 730 may also include a list of the possible defects in a descending order of occurrence possibility for each of the storage regions of the memory device. For example, the read retry table 730 may include K read retry sets as illustrated in FIG. 14. The processor 720 may select, from the read retry table 730, a read retry set in a descending order of the occurrence possibility of a type of defect in the storage region in which the error occurred. The is processor 720 will terminate the read retry operation when the error is corrected. By selecting a read retry set that is optimized for each region, the controller 710 may reduce the time required for the read retry operation substantially.

Figure 7B:
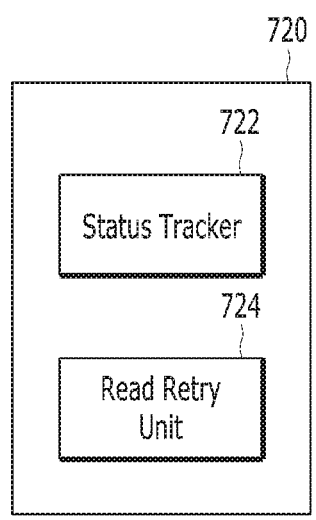
FIG. 7B is a diagram illustrating a processor in accordance with an embodiment.

FIG. 7B is a diagram illustrating the processor 720 of FIG. 7A.

Referring to FIG. 7B, the processor 720 may include a status tracker 722 and a read retry unit 724. The status tracker 722 may track and write status information on the plurality of storage regions included in the memory device 750. In various embodiments, the status information may include one or more of an erase/write (E/W) cycle count, a read count and temperature information. The E/W cycle count may include an E/W cycle count for one block. The read count may include a read count for one page. The temperature information may include information on a temperature measured in the controller 710 or the memory device 750.

When a read error occurs in a storage region included in the memory device 750, the read retry unit 724 may determine the occurrence possibilities for each of the plurality of possible different type of defects, based on the status information tracked by the status tracker 722 for the storage region where the error occurred. The read retry unit 724 may sort the plurality of defects in descending order of their occurrence possibilities, and perform read retry operations according to a read retry set selected according to the sorted defect order. The read retry unit 724 may select a read retry set among the plurality of read retry sets included in the read retry table 730, according to the sorted defect order, and perform a read retry operation on the any one storage region using the selected read retry set.

Figure 8:
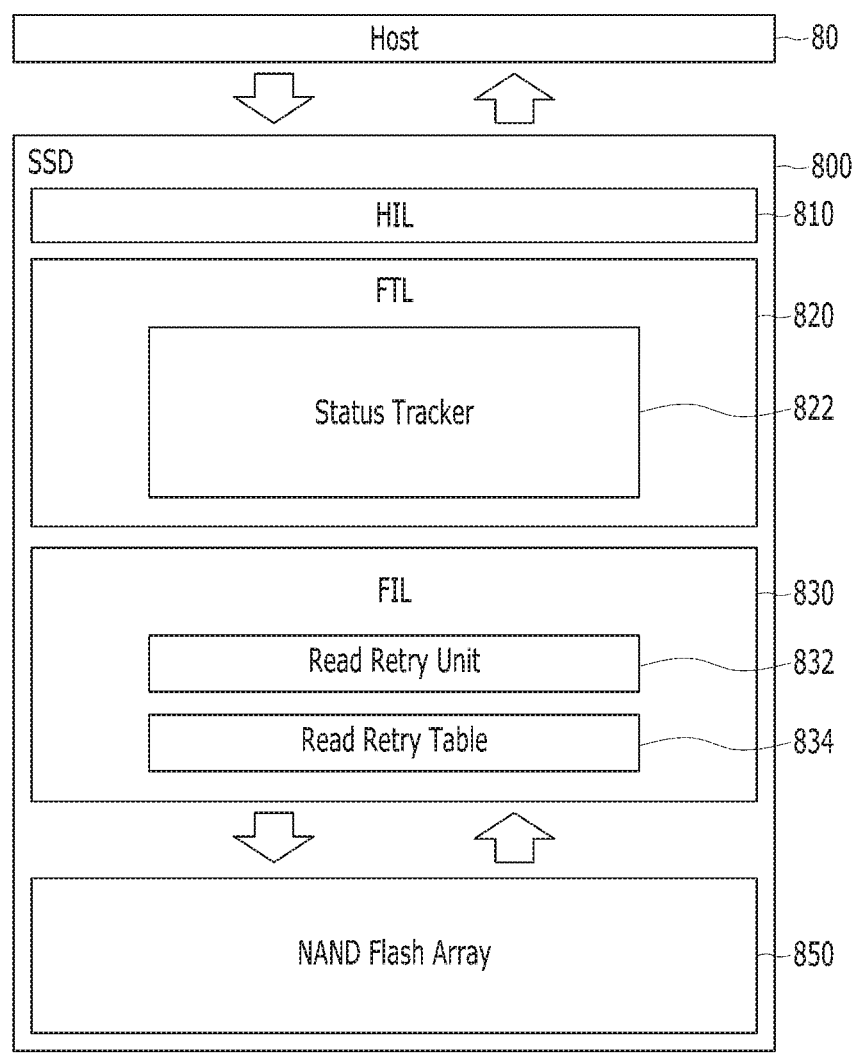
FIG. 8 is a diagram illustrating a data processing system in accordance with another embodiment.

FIG. 8 is a diagram illustrating a data processing system in accordance with another embodiment.

Referring to FIG. 8, the data processing system may include a host 80 and a solid state drive (SSD) 800 serving as a memory system (or storage device). The host 80 may request various operations such as read, write and erase operations for the SSD 800. The SSD 800 may include a NAND flash array 850 as a storage medium including a plurality of storage regions. The NAND flash array 850 may include a plurality of blocks, and each of the blocks may include a plurality of pages.

The SSD 800 may include a controller that stores data provided from the host 80 into the NAND flash array 850 in response to a write request from the host 80, or reads data stored in the NAND flash array 850 and provide the read data to the host 80 in response to a read request. The controller may be divided into a host interface layer (HIL) 810, a flash translation layer (FTL) 820 and a flash interface layer (FIL) 830. The HIL 810 may serve as a layer for an interface with the host 80, the FIL 830 may serve as a layer for an interface with the NAND flash array 850, and the FTL 820 may serve as a layer for translating data transmitted/received between the host 80 and the NAND flash array 850. The HIL 810 and the FIL 830 may correspond to the host interface 132 and the NFC 142 of the controller 130 illustrated in FIG. 1, respectively, and the FTL 820 may correspond to the other components of the controller 130 illustrated in FIG. 1. For convenience of description, the operations of the HIL 810, the FTL 820 and the FIL 830 may be limited to an example in which the HIL 810, the FTL 820 and the FIL 830 perform a read retry operation in accordance with the present embodiment.

The SSD 800 may perform various retry methods such as a read retry operation for a successful read operation, when a read error occurs. When a read error occurs even though all of the methods were used, a read fail will occur. For a read retry operation in accordance with various embodiments, the FTL 820 may include a status tracker 822, and the FIL 830 may include a read retry unit 832 and a read retry table 834.

The status tracker 822 may track and write status information on a plurality of storage regions (for example, blocks, dies or pages) included in the flash array 850. In various embodiments, the status information may include one or more of an erase/write (E/W) cycle count, a read count and temperature information. The E/W cycle count may include an E/W cycle count for one block. The read count may include a read count for one page. The temperature information may include information on a temperature measured by the controller or flash array 850 of the SSD 800.

When a read error occurs in any one storage region among the plurality of storage regions included in the flash array 850, the read retry unit 832 may determine occurrence possibilities for a plurality of different type of defects, respectively, based on the status information for the storage region tracked by the status tracker 822. The read retry unit 832 may sort the plurality of defects in descending order of the occurrence possibilities, and perform read retry operations according to the sorted defect order. The read retry unit 832 may select a read retry set among the plurality of read retry sets included in the read retry table 834, according to the sorted defect order, and perform a read retry operation on the any one storage region using the selected read retry set.

Figure 9:
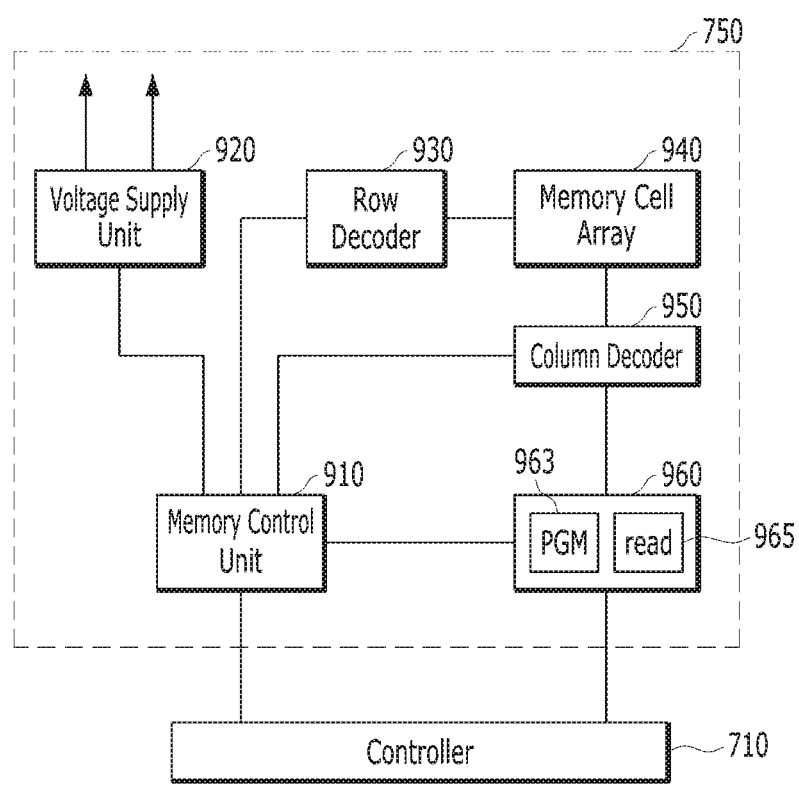
FIG. 9 is a diagram illustrating a memory device in accordance with an embodiment.

FIG. 9 is a diagram illustrating the memory device 750 of FIG. 7A in accordance with various embodiments.

Referring to FIG. 9, the memory device 750 may include a memory control unit 910, a voltage supply unit 920, a row decoder 930, a memory cell array 940, a column decoder 950 and a program/read circuit 960.

The memory device 750 may include a flash memory device such as NAND flash or NOR flash, ferroelectrics random access memory (FeRAM), phase-change random access memory (PCRAM), magnetic random access memory (MRAM) or resistive random access memory (ReRAM).

The memory cell array 940 may be coupled to a plurality of word lines WL and a plurality of bit lines BL. The memory cell array 940 may include a plurality of memory cells arranged at the respective intersections between the plurality of word lines WL and the plurality of bit lines BL. The memory cell array 940 may receive an address ADDR for indicating a memory cell to be accessed with a command CMD. The address ADDR may include a row address X_ADDR for selecting word lines WL of the memory cell array 940 and a column address Y_ADDR for selecting a bit line of the memory cell array 940.

The row decoder 930 may be coupled to the memory cell array 940 through the word lines WL, and select one or more of the word lines in response to the row address X_ADDR from the memory control unit 910. The column decoder 950 may be coupled to the memory cell array 940 through the bit lines BL, and select one or more of the bit lines in response to the column address Y_ADDR from the memory control unit 910.

The program/read circuit 960 may include a program circuit 963 and a read circuit 965. The program circuit 963 may be coupled to a bit line BL selected through the column decoder 950, and perform a program operation (or data write operation) by providing a program pulse to a selected memory cell of the memory cell array 940. The read circuit 965 may be coupled to a bit line BL selected through the column decoder 950, sense the level of a selected memory cell of the memory cell array 940, and read (or output) data stored therein. The read circuit 965 may output data to the outside of the memory device 750, for example, the controller 710.

The voltage supply unit 920 may generate various types of voltages for performing program, read and erase operations on the memory cell array 940, based on voltage control of the memory control unit 910. The voltage supply unit 920 may generate driving voltages (or bias voltages) for driving the plurality of word lines WL and bit lines BL through the row decoder 930 and the column decoder 950, respectively. Then, the voltage supply unit 920 may provide the row decoder 930 and the column decoder 950 with the corresponding driving voltages. For example, the driving voltages may include a program voltage, reset voltage, read voltage and cutoff voltage.

The memory control unit 910 may output voltage control signals to the voltage supply unit 920, based on a command CMD, an address ADDR and a control signal CTRL, which are received from the controller 710. The voltage control signals may be used to program data to the memory cell array 940 or read data from the memory cell array 940. The voltage control signals outputted from the memory control unit 910 may be provided to the program/read circuit 960, the voltage supply unit 920, the row decoder 930 and the column decoder 950. The memory control unit 910 may control overall operations of the memory device 750.

In accordance with the various embodiments, the memory control unit 910 may read data stored in the memory cell array 940 and output the read data to the controller 710, based on the command CMD, the address ADDR and the control signal CTRL, which are received from the controller 710. At this time, the memory control unit 910 may output voltage control signals for reading data from the memory cell array 940 to the voltage supply unit 920.

When a read error occurred, the memory control unit 910 may receive information on a read voltage level for read retry, provided from the controller 710, that is, a voltage control signal, and output the voltage control signal to the voltage supply unit 920 such that the corresponding read voltage is supplied to the memory cell array 940.

In accordance with various embodiments, the read retry table may be included in the memory controller 710 as illustrated in FIGS. 7A and 7B. Alternatively, the read retry table may be included in the memory device 750.

Figure 10:
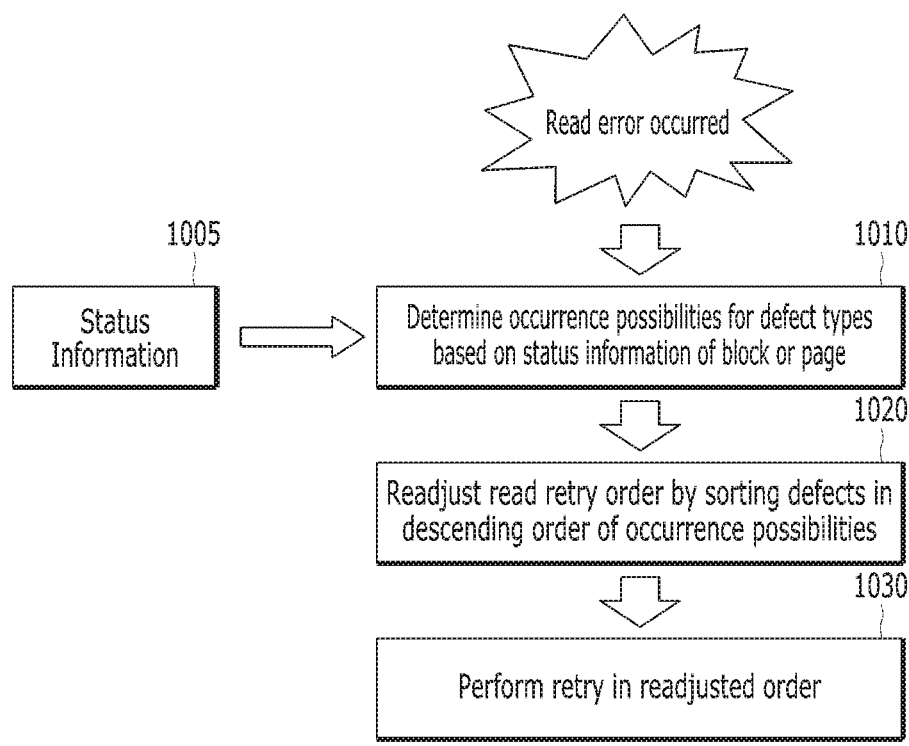
FIG. 10 is a diagram illustrating a flow of a read retry operation in accordance with an embodiment.

FIG. 10 is a diagram illustrating a flow of the read retry operation in accordance with an embodiment. This read retry operation may be performed by the memory controller 710 illustrated in FIGS. 7A and 7B and/or the controller of the SSD 800 illustrated in FIG. 8.

Referring to FIG. 10, a read error may occur in any one storage region among the plurality of storage regions included in the memory device, for example, 750 of FIGS. 7A and 7B.

When the read error occurs, the controller may determine occurrence possibilities for the plurality of different type of defects, is respectively, based on status information 1005 on the storage region (for example, block or page) where the error occurred at step 1010. That is, the controller may determine the occurrence possibility for each defect type for the region where the error occurred.

At step 1020, the controller may readjust a read retry order by sorting the plurality of defects in descending order of the occurrence possibilities.

At step 1030, the controller may perform a read retry operation according to the sorted defect order. The controller may select a read retry set among the plurality of read retry sets included in the read retry table, according to the sorted defect order, and perform a read retry operation on the storage region where the read error occurred, using the selected read retry set.

Figure 11:
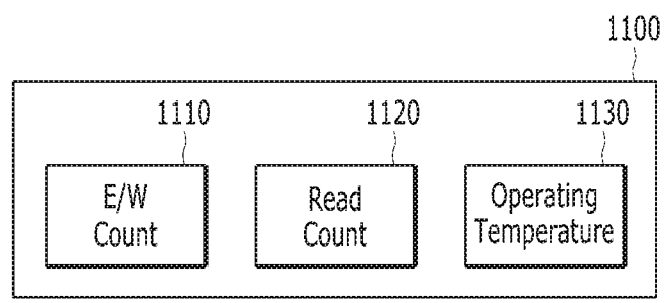
FIG. 11 is a diagram illustrating a status tracker in accordance with an embodiment.

FIG. 11 is a diagram illustrating a status tracker 1100 in accordance with an embodiment. The status tracker 1100 may correspond to the status tracker 722 illustrated in FIG. 7B and/or the status tracker 822 illustrated in FIG. 8.

Referring to FIG. 11, the status tracker 1100 may track and write status information on the plurality of storage regions (for example, blocks, dies or pages) included in the memory device. The status tracker 1100 may track and write status information including first to third status values 1110 to 1130. In some embodiments, the status information may include three kinds of status values. However, the present embodiments are not limited thereto.

The first status value 1110 may include an erase/write (E/W) cycle count. The E/W cycle count may include an E/W cycle count for one block. The second status value 1120 may include a read count. The read count may include a read count for one page. The third status value 1130 may include an operating temperature. The operating temperature may include a temperature value measured by the controller or flash array 850 of the SSD 800.

FIG. 12 is a diagram illustrating an example in which status information is written for each of the storage regions of the memory device by the status tracker 1100 illustrated in FIG. 11. In various embodiments, the status information may be stored in a table (not shown) within the status tracker 1100 or out of the status tracker 1100.

Referring to FIG. 12, various status information may be written for each of the plurality of regions (for example, N regions) included in the memory device. The various status information may include an erase/write (E/W) count, read count and operating temperature which have been described with reference to FIG. 11.

FIG. 13 is a diagram illustrating an example in which the occurrence possibility of a read error is decided in each of the storage regions based on the possibilities of each possible defect in each region included in a memory device in accordance with an embodiment. This determination may be performed by the read retry unit 724 illustrated in FIG. 7B and/or the read retry unit 832 illustrated in FIG. 8.

Referring to FIG. 13, the read retry unit may determine the occurrence possibilities (or probabilities) for a plurality of different type of defects, respectively, based on the status information on the plurality of storage regions included in the memory device, and store the decision results in the form of a table. Such a table may be updated in response to when the status information on each of the storage regions is updated by the status tracker 722 or 822.

For the first storage region Region1, a first defect may have the highest occurrence possibility, a second defect may have the second highest occurrence possibility, a third defect may have the third highest occurrence possibility, and a fourth defect may have the lowest occurrence possibility. That is, the occurrence possibilities for the first storage region Region1 may have an order of Defect1→Defect2→Defect3→Defect4.

For the second storage region Region2, the second defect may have the highest occurrence possibility, the first defect may have the second highest occurrence possibility, the third defect may have the third highest occurrence possibility, and the fourth defect may have the lowest occurrence possibility. That is, the occurrence possibilities for the second storage region Region2 may have an order of Defect2→Defect1→Defect3→Defect4.

For the third storage region Region3, the third defect may have the highest occurrence possibility, the fourth defect may have the second highest occurrence possibility, the first defect may have the third highest occurrence possibility, and the second defect may have the lowest occurrence possibility. That is, the occurrence possibilities for the third storage region Region3 may have an order of Defect3→Defect4→Defect1→Defect2.

For the Nth storage region RegionN, the fourth defect may have the highest occurrence possibility, the third defect may have the second highest occurrence possibility, the second defect may have the third highest occurrence possibility, and the first defect may have the lowest occurrence possibility. That is, the occurrence possibilities for the Nth storage region RegionN may have an order of Defect4→Defect3→Defect2→Defect1.

In an embodiment, the read retry unit may normalize possibility decision elements of the corresponding storage region (e.g., block or page) to values between 1 and 100, and compare the normalized possibility decision elements to result values obtained by multiplying given weights by the respective defects, thereby determining the occurrence possibilities (or occurrence probabilities) for the respective defects. The read retry unit may determine that a defect having a relatively large result value has a higher occurrence possibility than a defect having a relatively small result value. The read retry unit can determine occurrence possibilities for the following four kinds of defects.

(Defect 1) Endurance (EN)
1-1) Possibility decision element: E/W cycle count of block
1-2) EN=$W^{EN}$*(Current E/W Cycle/Max allowable E/W Cycle)*100

Here, Current E/W Cycle may represent the current E/W cycle, and Max allowable E/W Cycle may represent the maximum allowable E/W cycle.

(Defect 2) Read Disturb (RD)
2-1) Possibility decision element: read count for one page
2-2) RD=$W^{RD}$ (Current read count/Max allowable read count)*100

Here, Current read count may represent the current read count, and Max allowable read count may represent the maximum allowable read count.

(Defect 3) Cross Temperature (CT)
3-1) Possibility decision element: temperature difference between when page is written and when page is read
3-2) CT=$W^{CT}$*((Read Temp.−Write Temp.)/(Max Operating Temp.−Min Operating Temp.))*100

Here, Read Temp. may represent a temperature value during the read operation, Write Temp. may represent a temperature value during the write operation, Max Operating Temp. may represent the maximum operating temperature value, and Min Operating Temp. may represent the minimum operating temperature value.

(Defect 4) Data Retention (DR)
4-1) Possibility decision element: elapsed time after block is written
4-2) Time cannot be measured during DR (=Power Off)
(Defect5) Open Block Case with Above Error Conditions
5-1) When all blocks are not written, the characteristic differs from when all of the blocks are written. Thus, this case needs a sign.
5-2) When the corresponding block is an open block in case of a read error, a flag is set.

Here, $W^{EN}$, $W^{RD}$ and $W^{CT}$ may represent weights for comparing defect elements one to one, the defect elements having different levels of influence on a shaft of Vth distribution. The weights may be acquired through a test.

In various embodiments, since there are no methods capable of measuring a time during power-off in the case of data retention, the read retry unit may preferentially consider the data retention when the values of the other three defect elements correspond to such a level that causes a fail.

After the occurrence possibilities for the respective defects are determined in each of the storage regions, the read retry unit may perform read retry operations according to the occurrence possibilities.

The read retry unit may sort the normalized values for the respective defects in descending order, and decide an application order for the entries of the read retry table according to the sorted order. That is, the read retry unit may select a read retry set among the plurality of read retry sets included in the read retry table, according to the sorted defect order, and perform a read retry operations using the selected read retry set. For example, when the occurrence possibilities for the defects have a relation of RD>EN>CT, the read retry unit may perform read retry operations by applying the corresponding read retry sets in order of Read Disturb→Endurance→Temperature. Furthermore, the read retry unit may determine the application order of the read retry sets even for the same defect, according to the normalized values. For example, when the value of the normalized read disturb RD is 50, the read retry unit can preferentially apply a read retry value corresponding to an intermediate level of read disturb. Also, when a read error occurred even though the normalized values of EN, RD and CT are all equal to or less than reference values, the read retry unit may consider the data retention. Furthermore, the read retry unit may check an open block flag, and apply EN, DR, RD and CT read retry operations reflecting the characteristic of the open block when the open block flag is set.

FIG. 14 is a diagram illustrating an example in which a read retry table 1400 is provided for a plurality of defect types in accordance with an embodiment. For example, the read retry table 1400 may correspond to the read retry table 730 illustrated in FIG. 7A and/or the read retry table 834 illustrated in FIG. 8.

Referring to FIG. 14, the read retry table 1400 may include a plurality of read retry (RR) sets. For example, the read retry table 1400 may include K read retry sets 1410 to 1460. The plurality of read retry sets may correspond to a plurality of defect types, respectively. For example, the first read retry set 1410 may correspond to the first defect of FIG. 13, the second read retry set 1420 may correspond to the second defect of FIG. 13, the third read retry set 1430 may correspond to the third defect of FIG. 13, and the fourth read retry set 1440 may correspond to the fourth defect of FIG. 13.

The read retry unit may sort the plurality of defects in descending order of occurrence possibility, and perform read retry operations in the sorted defect order. That is, the read retry unit may select read retry sets among the plurality of read retry sets according to the sorted defect order, and perform the read retry operations using the selected read retry set.

For example, the present embodiment may be based on the supposition that the first to fourth read retry sets 1410 to 1440 correspond to the first to fourth defects illustrated in FIG. 13, respectively. Under such a supposition, when the occurrence possibilities for the first storage region Region1 have an order of Defect1→Defect2→Defect3→Defect4 as illustrated in FIG. 13, the read retry unit may select the read retry sets in an order of the first read retry set 1410→the second read retry set 1420 the third read retry set 1430→the fourth read retry set 1440.

For another example, when the occurrence possibilities for the second storage region Region2 have an order of Defect2→Defect→Defect3→Defect4 as illustrated in FIG. 13, the read retry unit may select the read retry sets in an order of the second read retry set 1420→the first read retry set 1410→the third read retry set 1430→the fourth read retry set 1440.

For another example, when the occurrence possibilities for the third storage region Region3 have an order of Defect3→Defect4→Defect1→Defect2 as illustrated in FIG. 13, the read retry unit may select the read retry sets in an order of the third read retry set 1430→the fourth read retry set 1440→the first read retry set 1410→the second read retry set 1420.

For another example, when the occurrence possibilities for the Nth storage region RegionN have an order of Defect4→Defect3→Defect2→Defect1 as illustrated in FIG. 13, the read retry unit may select the read retry sets in an order of the fourth read retry set 1440→the third read retry set 1430→the second read retry set 1420→the first read retry set 1410.

Figure 15:
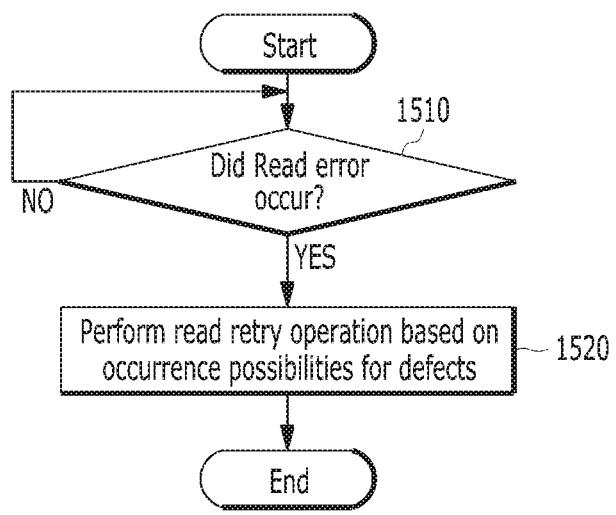
FIG. 15 is a flowchart illustrating a read retry operation in accordance with an embodiment.

FIG. 15 is a flowchart illustrating a read retry operation in accordance with an embodiment. This operation may be performed by the memory controller 710 illustrated in FIGS. 7A and 7B and/or the controller of the SSD 800 illustrated in FIG. 8. Hereafter, the memory controller 710 and the controller of the SSD 800 will be collectively referred to as "controller".

Referring to FIG. 15, the controller may determine whether a read error occurred in any one storage region among a plurality of storage regions included in a memory device, at step 1510. When determining that a read error occurred, the controller may perform read retry operations based on occurrence possibilities for a plurality of different type of defects, respectively, in the any one storage region, at step 1520.

In various embodiments, the controller may determine the occurrence possibilities for the respective defects based on status information on the any one storage region. The status information may include one or more of an erase/write (E/W) cycle count, a read count and temperature information.

In various embodiments, the controller may sort the plurality of defects in descending order of the occurrence possibilities, and perform read retry operations in the sorted defect order.

In various embodiments, the controller may select a read retry set among the plurality of read retry sets included in the read retry table, according to the sorted defect order, and perform a read retry operation on the any one storage region using the selected read retry set.

In various embodiments, the controller may normalize possibility decision elements of the respective defects, and decide the occurrence possibilities for the respective defects by multiplying given weights by the normalized possibility decision elements.

In various embodiments, the plurality of defects may include two or more of a first defect related to the E/W cycle count, a second defect related to the read count, a third defect related to a difference in temperature between during read operation and during write operation, and a fourth defect related to an elapsed time after write operation. In various embodiments, the controller may select the fourth defect when the values of the possibility decision elements for the first to third defects are smaller than predetermined values, respectively, and perform a read retry operation on the any one storage region using the read retry set corresponding to the selected fourth set.

Figure 16:
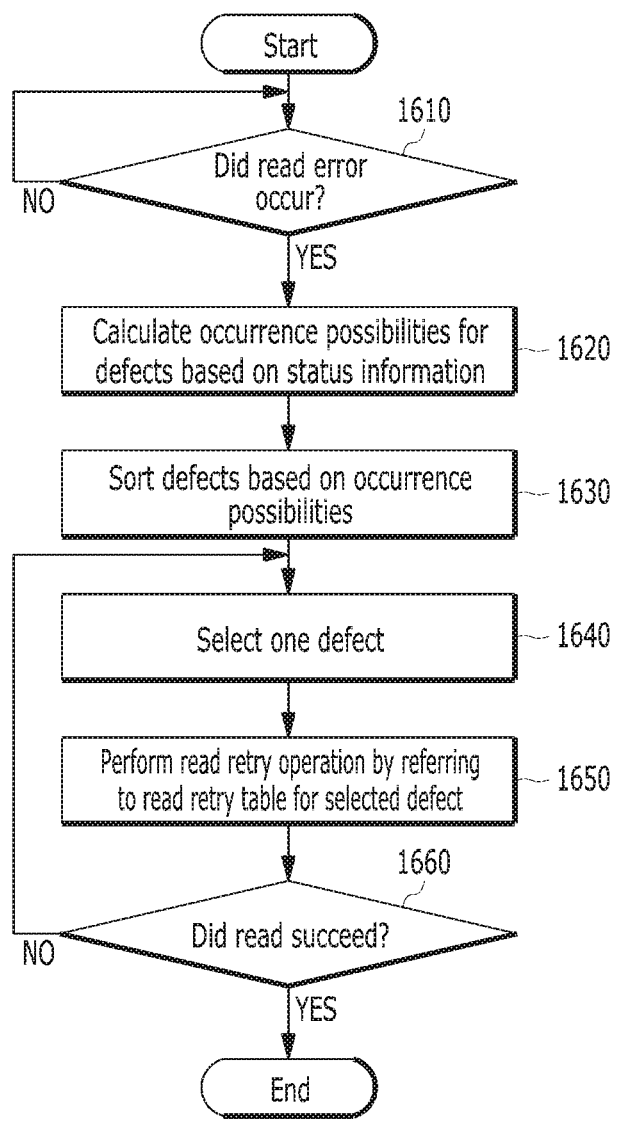
FIG. 16 is a flowchart illustrating a read retry operation in accordance with another embodiment.

FIG. 16 is a flowchart illustrating a read retry operation in accordance with another embodiment. This operation may be performed by the memory controller 710 illustrated in FIGS. 7A and 7B and/or the controller of the SSD 800 illustrated in FIG. 8. Hereafter, the memory controller 710 and the controller of the SSD 800 will be collectively referred to as "controller".

Referring to FIG. 16, the controller may determine whether a read error occurred in any one storage region among a plurality of storage regions included in a memory device, at step 1610. When determining that a read error occurred, the controller may calculate occurrence possibilities for a plurality of different type of defects, respectively, based on status information on the storage region where the read error occurred, at step 1620. The status information may include one or more of an erase/write (E/W) cycle count, a read count and temperature information. In various embodiments, the controller may normalize the possibility decision elements of the respective defects, and decide the occurrence possibilities for the respective defects by multiplying given weights by the normalized possibility decision elements.

At step 1630, the controller may sort the plurality of defects in descending order of the occurrence possibilities. In various embodiments, the plurality of defects may include two or more of a first defect related to the E/W cycle count, a second defect related to the read count, a third defect related to a difference in temperature between during read operation and during write operation, and a fourth defect related to an elapsed time after write operation.

At step 1640, the controller may select the defect having the highest occurrence possibility among the sorted defects. At step 1650, the controller may select the read retry set corresponding to the selected defect, and perform a read retry operation on the any one storage region using the selected read retry set. At step 1660, the controller may determine whether the read operation has been successfully performed as the result of the read retry operation, at step 1650.

When the read retry operation result indicates that the read operation has been successfully performed, the procedure may be ended. Otherwise, the procedure may return to step S1640.

After returning to step S1640, the controller may select the defect having the second highest occurrence possibility among the sorted defects, select the read retry set corresponding to the selected defect, and perform a read retry operation on the any one storage region using the selected read retry set.

The read retry method in accordance with the various embodiments can determine occurrence possibilities for the respective defect types when a read error occurred, and perform read retry operations in descending order of the occurrence possibilities. The read retry method in accordance with the present embodiments can predict defects which are likely to occur in each of the storage regions of the memory device, and perform read retry operations from the read retry operation for the defect having the highest occurrence possibility, thereby shortening the time required for error correction.

Furthermore, the read retry method in accordance with the present embodiments can uniformize correction times for different read errors, and thus improve the quality of service (QoS) of a read request.

Hereinafter, a data processing system and electronic equipment provided with the memory system 110 including the memory device 150 and the controller 130 described with reference to FIGS. 1 to 16 in accordance with an embodiment will be described in more detail with reference to FIGS. 17 to 25.

FIGS. 17 to 25 are diagrams schematically illustrating application examples of the data processing system of FIG. 1 in accordance with various embodiments of the present disclosure.

Figure 17:
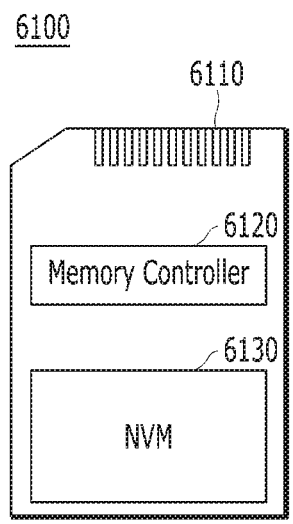
FIGS. 17 to 25 are diagrams schematically illustrating application examples of the data processing system of FIG. 1 in accordance with various embodiments of the present disclosure.

FIG. 17 is a diagram schematically illustrating another example of the data processing system including the memory system in accordance with an embodiment of the present disclosure. FIG. 17 schematically illustrates a memory card system to which the memory system in accordance with an embodiment is applied.

Referring to FIG. 17, the memory card system 6100 may include a connector 6110, a memory controller 6120, and a memory device 6130.

More specifically, the memory controller 6120 may be connected to the memory device 6130 embodied by a nonvolatile memory, and configured to access the memory device 6130. For example, the memory controller 6120 may be configured to control read, write, erase and background operations of the memory device 6130. The memory controller 6120 may be configured to provide an interface between the memory device 6130 and a host, and drive firmware for controlling the memory device 6130. That is, the memory controller 6120 may correspond to the controller 130 of the memory system 110 described with reference to FIG. 1, and the memory device 6130 may correspond to the memory device 150 of the memory system 110 described with reference to FIG. 1.

Thus, the memory controller 6120 may include a random access memory (RAM), a processing unit, a host interface, a memory interface and an error correction unit. The memory controller 130 may further include the elements shown in FIG. 5.

The memory controller 6120 may communicate with an external device, for example, the host 102 of FIG. 1 through the connector 6110. For example, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), wireless fidelity (WI-FI) and Bluetooth. Thus, the memory system and the data processing system in accordance with an embodiment may be applied to wired/wireless electronic devices or particularly mobile electronic devices.

The memory device 6130 may be implemented by a nonvolatile memory. For example, the memory device 6130 may be implemented by various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM). The memory device 6130 may include a plurality of dies as in the memory device 150 of FIG. 1.

The memory controller 6120 and the memory device 6130 may be integrated into a single semiconductor device. For example, the memory controller 6120 and the memory device 6130 may construct a solid state drive (SSD) by being integrated into a single semiconductor device. Also, the memory controller 6120 and the memory device 6130 may construct a memory card such as a PC card (e.g., Personal Computer Memory Card International Association (PCM-CIA)), a compact flash (CF) card, a smart media card (e.g., SM and SMC), a memory stick, a multimedia card (e.g., MMC, RS-MMC, MMCmicro and eMMC), an SD card (e.g., SD, miniSD, microSD and SDHC) and a universal flash storage (UFS).

Figure 18:
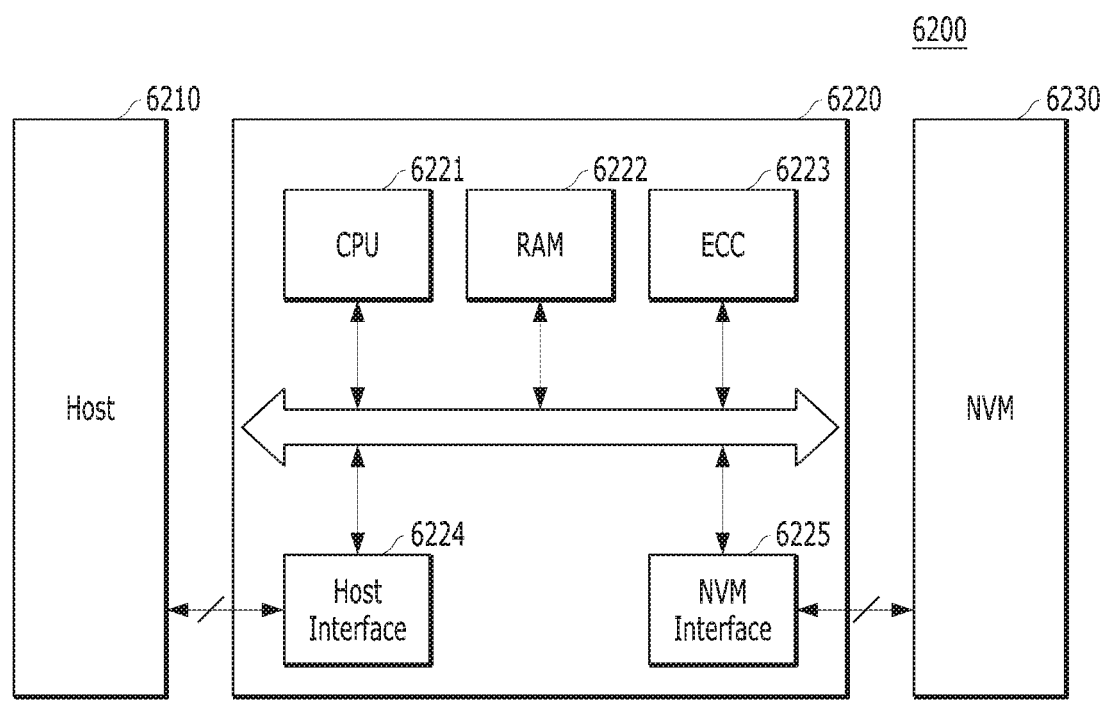

FIG. 18 is a diagram schematically illustrating another example of the data processing system including the memory system in accordance with an embodiment of the present disclosure.

Referring to FIG. 18, the data processing system 6200 may include a memory device 6230 having one or more nonvolatile memories (NVMs) and a memory controller 6220 for controlling the memory device 6230. The data processing system 6200 illustrated in FIG. 13 may serve as a storage medium such as a memory card (e.g., CF, SD, micro-SD or the like) or USB device, as described with reference to FIG. 1. The memory device 6230 may correspond to the memory device 150 in the memory system 110 illustrated in FIG. and the memory controller 6220 may correspond to the controller 130 in the memory system 110 illustrated in FIG. 1.

The memory controller 6220 may control a read, write or erase operation on the memory device 6230 in response to a request of the host 6210, and the memory controller 6220 may include a central processing unit (CPU) 6221, a random access memory (RAM) as a buffer memory 6222, an error correction code (KC) circuit 6223, a host interface 6224 and an NVM interface as a memory interface 6225.

The CPU 6221 may control overall operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the low-speed memory device 6230 to operate at high speed.

The ECC circuit 6223 may correspond to the ECC unit 138 of the controller 130 illustrated in FIG. 1. As described with reference to FIG. 1, the ECC circuit 6223 may generate an error correction code for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. At this time, the ECC circuit 6223 may correct an error using the parity bit. For example, as described with reference to FIG. 1, the ECC circuit 6223 may correct an error using any suitable method including a coded modulation such as a low density parity check (LDPC) code, a Bose-Chaudhuri-Hocquenghem (BCH) code, a turbo code, Reed-Solomon (RS) code, a convolution code, a recursive systematic code (RSC), a trellis-coded modulation (TCM) or a Block coded modulation (BCM).

The memory controller 6220 may transmit/receive data to/from the host 6210 through the host interface 6224, and transmit/receive data to/from the memory device 6230 through the NVM interface 6225. The host interface 6224 may be connected to the host 6210 through at least one of various interface protocols such as a parallel advanced technology attachment (PATA) bus, a serial advanced technology attachment (SATA) bus, a small computer system interface (SCSI), a universal serial bus (USB), a peripheral component interconnection express (PCIe) or a NAND interface. The memory controller 6220 may have a wireless communication function is with a mobile communication protocol such as wireless fidelity (WI-FI) or long term evolution (LTE). The memory controller 6220 may be connected to an external device, for example, the host 6210 or another external device, and then transmit/receive data to/from the external device. In particular, as the memory controller 6220 is configured to communicate with the external device through one or more of various communication protocols, the memory system and the data processing system in accordance with an embodiment may be applied to wired/wireless electronic devices or particularly a mobile electronic device.

Figure 19:
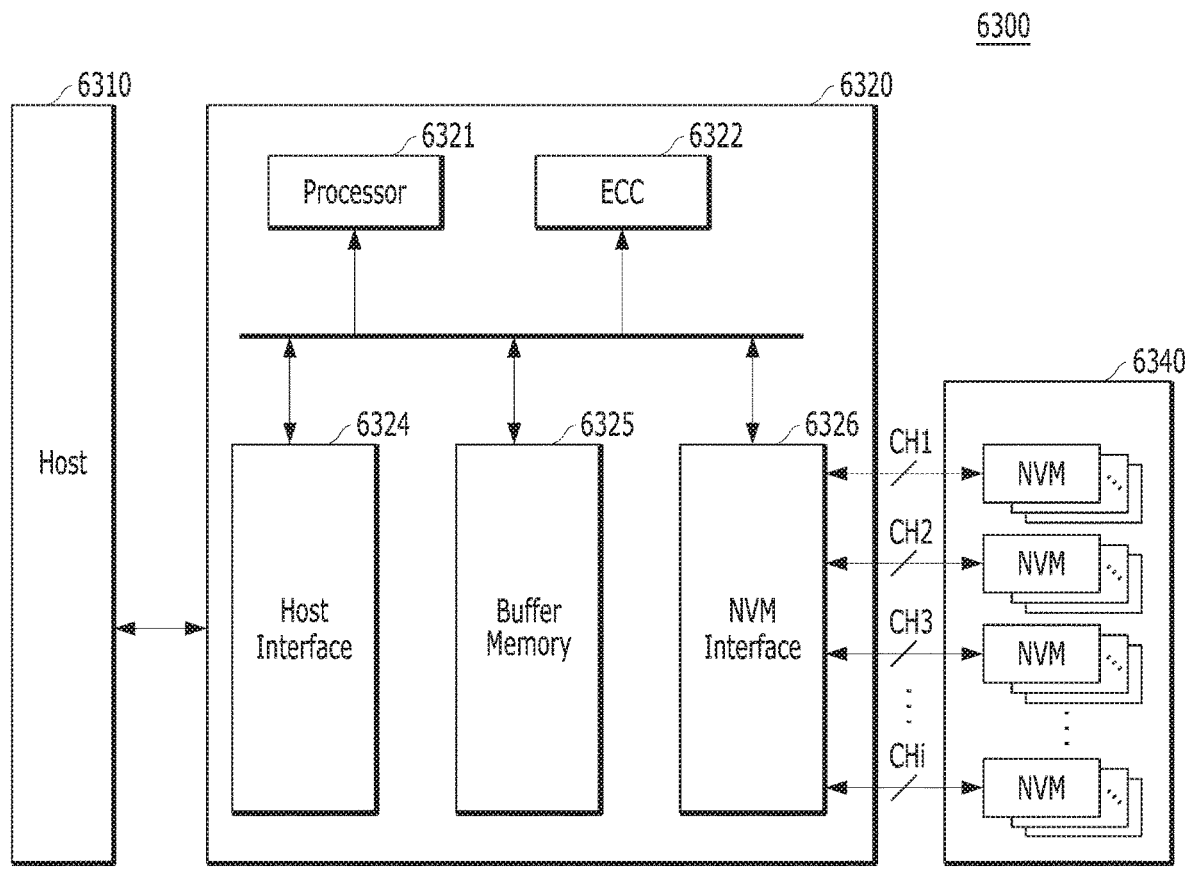

FIG. 19 is a diagram schematically illustrating another example of the data processing system including the memory system in accordance with an embodiment of the present disclosure. FIG. 19 schematically illustrates a solid state drive (SSD) 6300 to which the memory system in accordance with an embodiment is applied.

Referring to FIG. 19, the SSD 6300 may include a controller 6320 and a memory device 6340 including a plurality of nonvolatile memories. The controller 6320 may correspond to the controller 130 in the memory system 110 of FIGS. 1 and 5, and the memory device 6340 may correspond to the memory device 150 in the memory system of FIG. 1.

More specifically, the controller 6320 may be connected to the memory device 6340 through a plurality of channels CH1 to CHi. The controller 6320 may include a processor 6321, a buffer memory 6325, an error correction code (ECC) circuit 6322, a host interface 6324 and a nonvolatile memory interface as a memory interface 6326.

The buffer memory 6325 may temporarily store data provided from the host 6310 or data provided from a plurality of flash memories NVM included in the memory device 6340, or temporarily store meta data of the plurality of flash memories NVM, for example, map data including a mapping table. The buffer memory 6325 may be embodied by volatile memories such as a dynamic random access memory (DRAM), a synchronous dynamic random access memory (SDRAM), a double data rate (DDR) SDRAM, a low power double data rate (LPDDR) SDRAM and graphic random access memory (GRAM) or nonvolatile memories such as a ferroelectric random access memory (FRAM), a resistive random access memory (ReRAM), a spin-transfer torque magnetic random access memory (STT-MRAM) and a phase change random access memory (PRAM). For convenience of description, FIG. 19 illustrates that the buffer memory 6325 exists in the controller 6320. However, the buffer memory 6325 may exist outside the controller 6320.

The ECC circuit 6322 may calculate an ECC value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIG. 1 is applied may be provided to embody a data processing system, for example, a redundant array of independent disks (RAID) system. At this time, the RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, and output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 20:
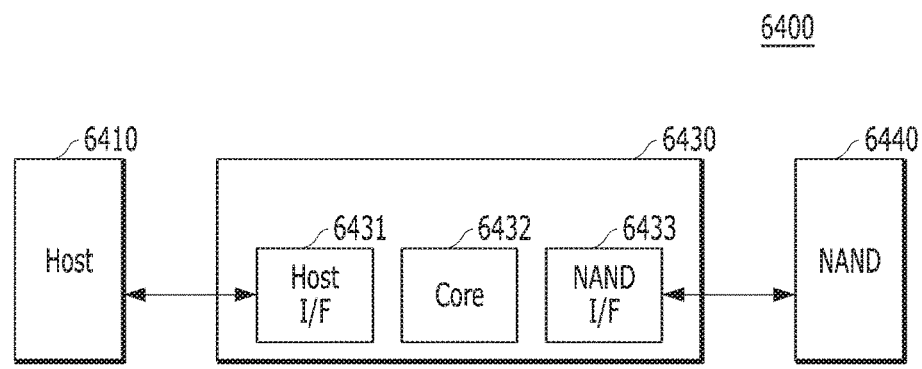

FIG. 20 is a diagram schematically illustrating another example of the data processing system including the memory system is in accordance with an embodiment of the present disclosure. FIG. 20 schematically illustrates an embedded Multi-Media Card (eMMC) to which the memory system in accordance with an embodiment is applied.

Referring to FIG. 20, the eMMC 6400 may include a controller 6430 and a memory device 6440 embodied by one or more NAND flash memories. The controller 6430 may correspond to the controller 130 in the memory system 110 of FIG. 1, and the memory device 6440 may correspond to the memory device 150 in the memory system 110 of FIG. 1.

More specifically, the controller 6430 may be connected to the memory device 6440 through a plurality of channels. The controller 6430 may include one or more cores 6432, a host interface 6431 and a memory interface, for example, a NAND interface 6433.

The core 6432 may control overall operations of the eMMC 6400, the host interface 6431 may provide an interface function between the controller 6430 and the host 6410, and the NAND interface 6433 may provide an interface function between the memory device 6440 and the controller 6430. For example, the host interface 6431 may serve as a parallel interface such as an MMC interface as described with reference to FIG. 1. Furthermore, the host interface 6431 may serve as a serial interface such as an ultra-high speed class 1 (UHS-I)/UHS class 2 (UHS-II) and a universal flash storage (UFS) interface.

FIGS. 21 to 24 are diagrams schematically illustrating other examples of the data processing system including the memory system in accordance with embodiments of the present disclosure. FIGS. 21 to 24 schematically illustrate universal flash storage (UFS) systems to which the memory system in accordance with an embodiment is applied.

Referring to FIGS. 21 to 24, the UFS systems 6500, 6600, 6700 and 6800 may include hosts 6510, 6610, 6710 and 6810, UFS devices 6520, 6620, 6720 and 6820 and UFS cards 6530, 6630, 6730 and 6830, respectively. The hosts 6510, 6610, 6710 and 6810 may serve as application processors of wired/wireless electronic devices or particularly mobile electronic devices, the UFS devices 6520, 6620, 6720 and 6820 may serve as embedded UFS devices, and the UFS cards 6530, 6630, 6730 and 6830 may serve as external embedded UFS devices or removable UFS cards.

The hosts 6510, 6610, 6710 and 6810, the UFS devices 6520, 6620, 6720 and 6820 and the UFS cards 6530, 6630, 6730 and 6830 in the respective UFS systems 6500, 6600, 6700 and 6800 may communicate with external devices, for example, wired and/or wireless electronic devices or particularly mobile electronic devices through UFS protocols, and the UFS devices 6520, 6620, 6720 and 6820 and the UFS cards 6530, 6630, 6730 and 6830 may be embodied by the memory system 110 illustrated in FIG. 1. For example, in the UFS systems 6500, 6600, 6700 and 6800, the UFS devices 6520, 6620, 6720 and 6820 may be embodied in the form of the data processing system 6200, the SSD 6300 or the eMMC 6400 described with reference to FIGS. 18 to 20, and the UFS cards 6530, 6630, 6730 and 6830 may be embodied in the form of the memory card system 6100 described with reference to FIG. 17.

Furthermore, in the UFS systems 6500, 6600, 6700 and 6800, the hosts 6510, 6610, 6710 and 6810, the UFS devices 6520, 6620, 6720 and 6820 and the UFS cards 6530, 6630, 6730 and 6830 may communicate with each other through an UFS interface, for example, MIPI M-PHY and MIPI Unified Protocol (UniPro) in Mobile Industry Processor Interface (MIPI). Furthermore, the UFS devices 6520, 6620, 6720 and 6820 and the UFS cards 6530, 6630, 6730 and 6830 may communicate with each other through various protocols other than the UFS protocol, for example, USB flash drives (UFDs), multimedia card (MMC), secure digital (SD), mini-SD, and micro-SD.

Figure 21:
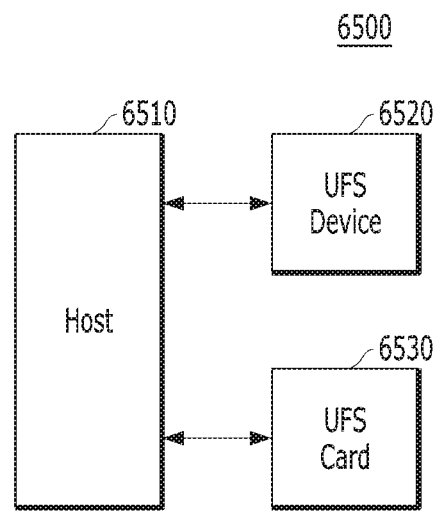

In the UFS system 6500 illustrated in FIG. 21, each of the host 6510, the UFS device 6520 and the UFS card 6530 may include UniPro. The host 6510 may perform a switching operation in order to communicate with the UFS device 6520 and the UFS card 6530. In particular, the host 6510 may communicate with the UFS device 6520 or the UFS card 6530 through link layer switching, for example, L3 switching at the UniPro. At this time, the UFS device 6520 and the UFS card 6530 may communicate with each other through link layer switching at the UniPro of the host 6510. In an embodiment, the configuration in which one UFS device 6520 and one UFS card 6530 are connected to the host 6510 has been exemplified for convenience of description. However, a plurality of UFS devices and UFS cards may be connected in parallel or in the form of a star to the host 6410, and a plurality of UFS cards may be connected in parallel or in the form of a star to the UFS device 6520 or connected in series or in the form of a chain to the UFS device 6520.

Figure 22:
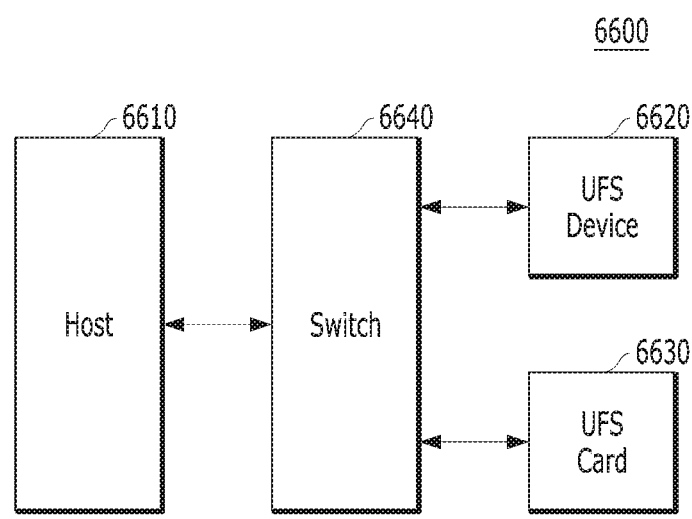

In the UFS system 6600 illustrated in FIG. 22, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In an embodiment, the configuration in which one UFS device 6620 and one UFS card 6630 are connected to the switching module 6640 has been exemplified for convenience of description. However, a plurality of UFS devices and UFS cards may be connected in parallel or in the form of a star to the switching module 6640, and a plurality of UFS cards may be connected in series or in the form of a chain to the UFS device 6620.

Figure 23:
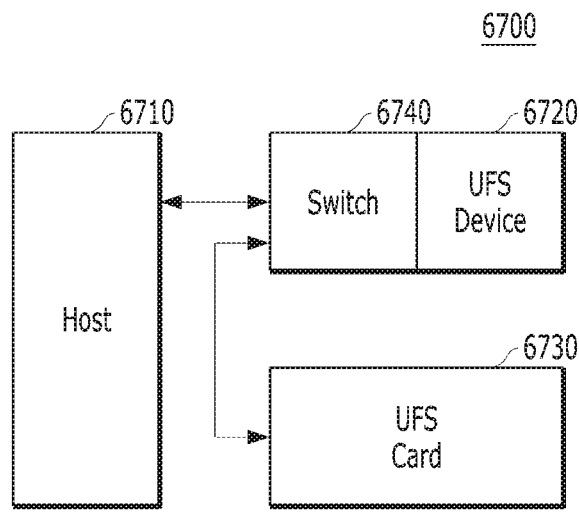

In the UFS system 6700 illustrated in FIG. 23, each of the host 6710, the UFS device 6720 and the UFS card 6730 may include UniPro, and the host 6710 may communicate with the UFS device 6720 or the UFS card 6730 through a switching module 6740 performing a switching operation, for example, through the switching module 6740 which performs link layer switching at the UniPro, for example, L3 switching. At this time, the UFS device 6720 and the UFS card 6730 may communicate with each other through link layer switching of the switching module 6740 at the UniPro, and the switching module 6740 may be integrated as one module with the UFS device 6720 inside or outside the UFS device 6720. In an embodiment, the configuration in which one UFS device 6720 and one UFS card 6730 are connected to the switching module 6740 has been exemplified for convenience of description. However, a plurality of modules each including the switching module 6740 and the UFS device 6720 may be connected in parallel or in the form of a star to the host 6710 or connected in series or in the form of a chain to each other. Furthermore, a plurality of UFS cards may be connected in parallel or in the form of a star to the UFS device 6720.

Figure 24:
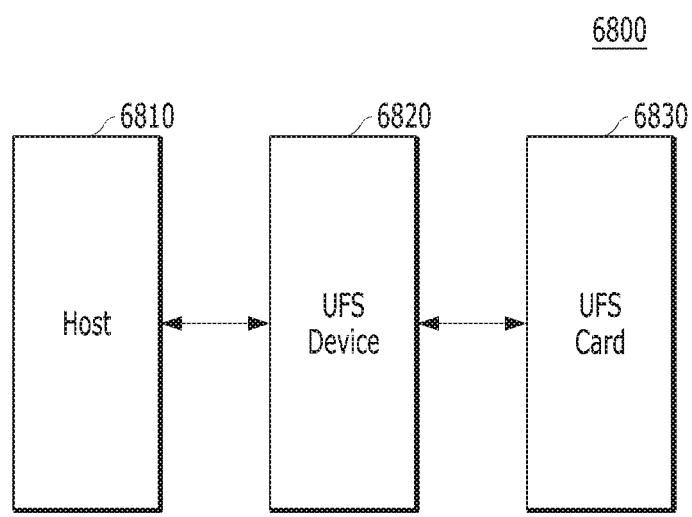

In the UFS system 6800 illustrated in FIG. 24, each of the host 6810, the UFS device 6820 and the UFS card 6830 may include M-PHY and UniPro. The UFS device 6820 may perform a switching operation in order to communicate with the host 6810 and the UFS card 6830. In particular, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target identifier (ID) switching operation. At this time, the host 6810 and the UFS card 6830 may communicate with each other through target ID switching between the M-PHY and UniPro modules of the UFS device 6820. In an embodiment, the configuration in which one UFS device 6820 is connected to the host 6810 and one UFS card 6830 is connected to the UFS device 6820 has been exemplified for convenience of description. However, a plurality of UFS devices may be connected in parallel or in the form of a star to the host 6810, or connected in series or in the form of a chain to the host 6810, and a plurality of UFS cards may be connected in parallel or in the form of a star to the UFS device 6820, or connected in series or in the form of a chain to the UFS device 6820.

Figure 25:
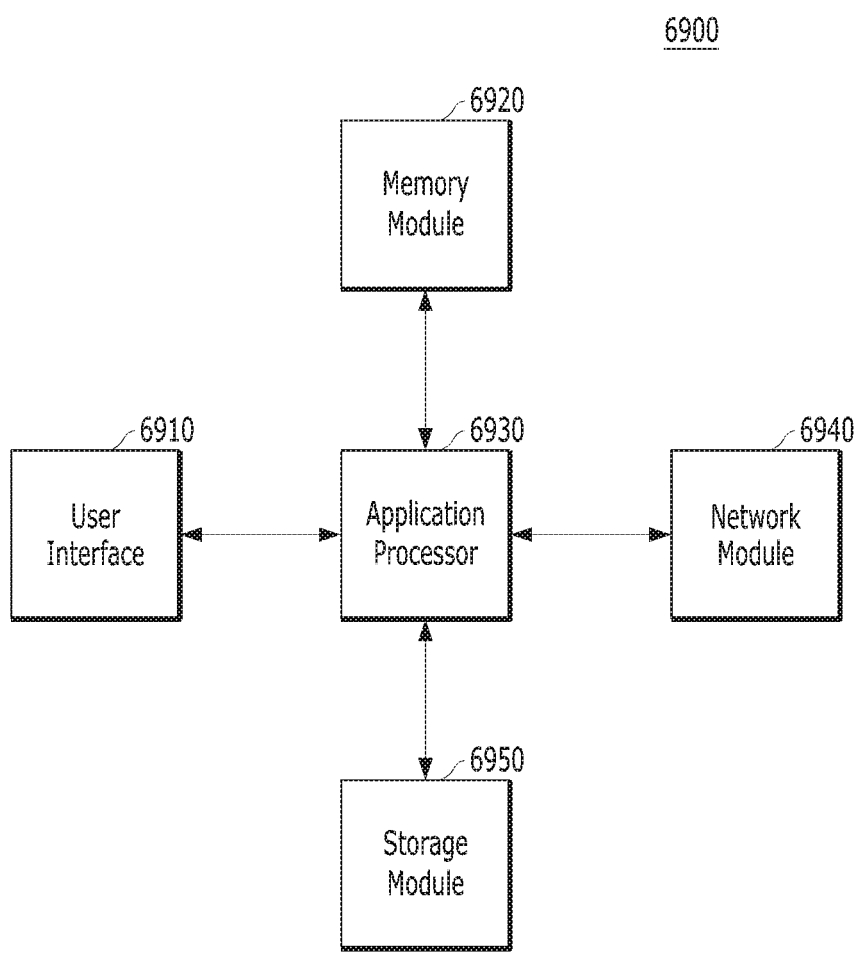

FIG. 25 is a diagram schematically illustrating another example of the data processing system including the memory system in accordance with an embodiment of the present disclosure. FIG. 25 is a diagram schematically illustrating a user system to which the memory system in accordance with an embodiment is applied.

Referring to FIG. 25, the user system 6900 may include an application processor 6930, a memory module 6920, a network module 6940, a storage module 6950 and a user interface 6910.

More specifically, the application processor 6930 may drive components included in the user system 6900, for example, an OS, and include controllers, interfaces and a graphic engine which control the components included in the user system 6900. The application processor 6930 may be provided as System-on-Chip (SoC).

The memory module 6920 may be used as a main memory, work memory, buffer memory or cache memory of the user system 6900. The memory module 6920 may include a volatile RAM such as a dynamic random access memory (DRAM), a synchronous dynamic random access memory (SDRAM), a double data rate (DDR) SDRAM, a DDR2 SDRAM, a DDR3 SDRAM, a low power double data rate (LPDDR) SDARM, an LPDDR2 SDRAM and an LPDDR3 SDRAM or a nonvolatile RAM such as a phase change random access memory (PRAM), a resistive random access memory (ReRAM), a magnetic random access memory (MRAM) and a ferroelectric random access memory (FRAM). For example, the application processor 6930 and the memory module 6920 may be packaged and mounted, based on a package-on-package (POP).

The network module 6940 may communicate with external devices. For example, the network module 6940 may not only support wired communication, but also support various wireless communication protocols such as code division multiple access (CDMA), global system for mobile communication (GSM), wideband CDMA (WCDMA), CDMA- 2000, time division multiple access (TDMA), long term evolution (LTE), worldwide interoperability for microwave access (WiMAX), wireless local area network (WLAN), ultra-wideband (UWB), Bluetooth, wireless display (WI-DI), thereby communicating with wired and/or wireless electronic devices or particularly mobile electronic devices. Therefore, the memory system and the data processing system, in accordance with an embodiment of the present invention, can be applied to wired and/or wireless electronic devices. The network module 6940 may be included in the application processor 6930.

The storage module 6950 may store data, for example, data provided from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, NOR flash and 3D NAND flash, and provided as a removable storage medium such as a memory card or external drive of the user system 6900. The storage module 6950 may correspond to the memory system 110 described with reference to FIG. 1. Furthermore, the storage module 6950 may be embodied as an SSD, eMMC and UFS as described above with reference to FIGS. 19 to 24.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, a light emitting diode (LED), a speaker and a motor.

Furthermore, when the memory system 110 of FIG. 1 is applied to a mobile electronic device of the user system 6900, the application processor 6930 may control overall operations of the mobile electronic device, and the network module 6940 may serve as a communication module for controlling wired and/or wireless communication with an external device. The user interface 6910 may display data processed by the processor 6930 on a display/touch module of the mobile electronic device, or support a function of receiving data from the touch panel.

Although various embodiments have been described for illustrative purposes, it will be apparent to those skilled in the art that various other embodiments, changes and modifications thereof may be made without departing from the spirit and scope of the invention as defined in the following claims.

What is claimed is:

1. A memory system comprising:
a plurality of storage regions, each including a plurality of memory cells; and
a controller configured to provide a plurality of predetermined read retry sets, determine an applying order of the plurality of predetermined read retry sets based on characteristics of a read error occurred in a first storage region among the plurality of storage regions, and apply at least one of the predetermined read retry sets, based on the applying order, for a read retry operation performed on the first storage region,
wherein each of the plurality of predetermined read retry sets corresponds to one of an erase/write (E/W) cycle, a read count, an operating temperature and an elapsed time after a write operation, which are associated with the first storage region among the plurality of storage regions.

2. The memory system of claim 1, wherein, when the characteristics of the read error are more relevant to the read count of the first storage region than the erase/write cycle, the operating temperature and the elapsed time, the controller invokes the read retry set corresponding to the read count with a higher priority.

3. The memory system of claim 1, wherein the characteristics of the read error depend on a usage status of the first storage region.

4. The memory system of claim 3, wherein the usage status comprises one or more of an erase/write (E/W) cycle, a read count and temperature information.

5. The memory system of claim 3, wherein the controller is configured to decide occurrence possibilities, each corresponding to each of the characteristics of the read error.

6. The memory system of claim 5, wherein the controller is configured to sort the characteristics of the read error in a descending order of the occurrence possibilities, and perform plural read retry operations according to a sorted order of the characteristics of the read error.

7. The memory system of claim 6, wherein the controller is configured to:
select a read retry set among the plurality of predetermined read retry sets according to the sorted order; and
perform a read retry operation on the first storage region using the selected read retry set.

8. The memory system of claim 7, wherein the characteristics of the read error comprises two or more of:
a first characteristic of read error related to an erase/write (E/W) cycle count;
a second characteristic of read error related to a read count;
a third characteristic of read error related to a difference in temperature between during read operation and during write operation; and
a fourth characteristic of read error related to an elapsed time after write operation.

9. The memory system of claim 8, wherein the controller is configured to normalize possibility decision elements for each of the characteristics of the read error, and is configured to decide the occurrence possibilities for each of the characteristics of the read error by multiplying the normalized possibility decision elements by given weights, respectively.

10. A memory system comprising:
a plurality of storage regions; and
a controller configured to provide a plurality of predetermined read retry sets, determine an order of the predetermined read retry sets based on a cause of a read error which occurs on a first storage region among the plurality of storage regions, and perform a read retry operation on the first storage region based on the order,
wherein each of the plurality of predetermined read retry sets corresponds to one of an erase/write (E/W) cycle, a read count, an operating temperature and an elapsed time after a write operation, which are associated with the first storage region among the plurality of storage regions.

11. The memory system of claim 10, wherein the cause of the read error is associated with a usage status of the first storage region.

12. The memory system of claim 11, wherein the usage status comprises one or more of an erase/write (E/W) cycle count, a read count and temperature information.

13. The memory system of claim 10, wherein the controller is configured to decide occurrence possibilities, each associated with the cause of the read error based on the usage status on the first storage region.

14. The memory system of claim 13, wherein the controller is configured to sort the order of the predetermined read retry sets in a descending order of the occurrence possibilities, and perform plural read retry operations according to a sorted order of the predetermined read retry sets.

15. The memory system of claim 13, wherein the controller is configured to sort the order of the predetermined read retry sets in a descending order of the occurrence possibilities, and perform plural read retry operations according to a sorted order of the predetermined read retry sets.

16. The memory system of claim 10, wherein, when the cause of the read error is more relevant to the read count of the first storage region than the erase/write cycle, the operating temperature and the elapsed time, the controller invokes the read retry set corresponding to the read count with a higher priority.

17. The memory system of claim 10, wherein the plurality of the causes of the read error comprises two or more of:
   a first cause of the read error related to an erase/write (E/W) cycle count;
   a second cause of the read error related to a read count;
   a third cause of the read error related to a difference in temperature between during read operation and during write operation; and
   a fourth cause of the read error related to an elapsed time after write operation.

18. A memory system comprising:
   a plurality of storage regions; and
   a controller configured to provide a plurality of predetermined read retry sets, determine an order of the predetermined read retry sets based on occurrence possibilities of a read error which occurs on a first storage region among the plurality of storage regions, and perform a read retry operation on the first storage region based on the order,
   wherein each of the plurality of predetermined read retry sets corresponds to one of an erase/write (E/W) cycle, a read count, an operating temperature and an elapsed time after a write operation, which are associated with the first storage region among the plurality of storage regions.

19. The memory system of claim 18, wherein the occurrence possibilities of a read error correspond to causes of the read error.

20. The memory system of claim 19, wherein the causes of the read error relate to usage status of the first storage region.

21. The memory system of claim 20, wherein the usage status comprises one or more of an erase/write (E/W) cycle count, a read count and temperature information.

22. The memory system of claim 18, wherein the plurality of the causes of the read error comprises two or more of:
   a first cause of the read error related to an erase/write (E/W) cycle count;
   a second cause of the read error related to a read count;
   a third cause of the read error related to a difference in temperature between during read operation and during write operation; and
   a fourth cause of the read error related to an elapsed time after write operation.

23. A memory system comprising:
   a plurality of storage regions; and
   a controller programmed to configure a read retry algorithm adaptively based on characteristics of read error which occurs on a first storage region among the plurality of storage regions, and to perform a read retry operation on the first storage region based on the adaptively configured read retry algorithm,
   wherein the characteristics of the read error relates to usage status of the first storage region,
   wherein the read retry algorithm is configured to provide a plurality of predetermined read retry sets, determine an applying order of the plurality of predetermined read retry sets based on characteristics of a read error occurred in a first storage region among the plurality of storage regions, and apply at least one of the predetermined read retry sets, based on the applying order, for a read retry operation performed on the first storage region, and
   wherein each of the plurality of predetermined read retry sets corresponds to one of an erase/write (E/W) cycle, a read count, an operating temperature and an elapsed time after a write operation, which are associated with the first storage region among the plurality of storage regions.

24. A memory system comprising:
   a plurality of storage regions, each including a plurality of memory cells; and
   a controller including predetermined read retry sets, programmed to invoke one having a higher priority among the predetermined read retry sets, the priority of the predetermined read retry sets being determined based on characteristics of a read error occurred in a first storage region among the plurality of storage regions, and apply the invoked read retry set for a read retry operation performed on the first storage region,
   wherein the characteristics of the read error relates to usage status of the first storage region,
   wherein each of the predetermined read retry sets corresponds to one of an erase/write (E/W) cycle, a read count, an operating temperature and an elapsed time after a write operation, which are associated with the first storage region among the plurality of storage regions.

25. A memory system comprising:
   a plurality of storage regions; and
   a controller programmed to reconfigure a read retry algorithm based on a usage status of a first storage region, which a read error occurs in, among the storage region, and to perform a read retry operation on the first storage region based on the reconfigured read retry algorithm,
   wherein the read retry algorithm is configured to provide a plurality of predetermined read retry sets, determine an applying order of the plurality of predetermined read retry sets based on characteristics of a read error occurred in a first storage region among the plurality of storage regions, and apply at least one of the predetermined read retry sets, based on the applying order, for a read retry operation performed on the first storage region, and
   wherein each of the plurality of predetermined read retry sets corresponds to one of an erase/write (E/W) cycle, a read count, an operating temperature and an elapsed time after a write operation, which are associated with the first storage region among the plurality of storage regions.

26. A memory system, comprising:
a plurality of memory blocks, each including a plurality of cells,
a controller configured to include a plurality of predetermined read retry sets, recognize on a read error from a first memory block among the plurality of memory blocks, and configure a read retry algorithm determining an applying order of the plurality of predetermined read retry sets based on a cause read error associated with the first memory block,
wherein each of the plurality of predetermined read retry sets corresponds to one of an erase/write (E/W) cycle, a read count, an operating temperature and an elapsed time after a write operation, which are associated with the first memory block among the plurality of memory blocks.

27. The memory system of claim 26, wherein the cause is determined based on which characteristic more highly affects the read error among other characteristics.

28. The memory system of claim 27, wherein the characteristic depends on usage status of the first memory block.

29. The memory system of claim 28, wherein the usage status comprises one or more of an erase/write (E/W) cycle, a read count and temperature information.

30. A memory system comprising:
a plurality of storage regions; and
a controller programmed to configure an error reducing algorithm adaptively based on characteristics of a read error which occurs on a first storage region among the plurality of storage regions, and to perform a read retry operation on the first storage region based on the adaptively configured error reducing algorithm,
wherein the characteristics of the read error relates to usage status of the first storage region,
wherein the error reducing algorithm is configured to provide a plurality of predetermined read retry sets, determine an applying order of the plurality of predetermined read retry sets based on characteristics of a read error occurred in a first storage region among the plurality of storage regions, and apply at least one of the predetermined read retry sets, based on the applying order, for a read retry operation performed on the first storage region, and
wherein each of the plurality of predetermined read retry sets corresponds to one of an erase/write (E/W) cycle, a read count, an operating temperature and an elapsed time after a write operation, which are associated with the first storage region among the plurality of storage regions.

31. A memory system comprising:
a plurality of storage regions; and
a controller programmed to reconfigure an error reducing algorithm based on a usage status of a first storage region, which a read error occurs in, among the storage region, and to perform a read retry operation on the first storage region based on the reconfigured error reducing algorithm,
wherein the error reducing algorithm is configured to provide a plurality of predetermined read retry sets, determine an applying order of the plurality of predetermined read retry sets based on characteristics of a read error occurred in a first storage region among the plurality of storage regions, and apply at least one of the predetermined read retry sets, based on the applying order, for a read retry operation performed on the first storage region, and
wherein each of the plurality of predetermined read retry sets corresponds to one of an erase/write (E/W) cycle, a read count, an operating temperature and an elapsed time after a write operation, which are associated with the first storage region among the plurality of storage regions.

* * * * *